US007738486B2

(12) United States Patent
Cole

(10) Patent No.: US 7,738,486 B2
(45) Date of Patent: Jun. 15, 2010

(54) MULTI-MODE INTEGRATED CIRCUIT FOR USE IN OPTOELECTRONIC DEVICES

(75) Inventor: Christopher R. Cole, Redwood City, CA (US)

(73) Assignee: Finisar Corporation, Sunnyvale, CA (US)

(*) Notice: Subject to any disclaimer, the term of this patent is extended or adjusted under 35 U.S.C. 154(b) by 161 days.

(21) Appl. No.: 12/039,669

(22) Filed: Feb. 28, 2008

(65) Prior Publication Data
US 2008/0205437 A1 Aug. 28, 2008

Related U.S. Application Data

(60) Provisional application No. 60/892,154, filed on Feb. 28, 2007, provisional application No. 60/892,132, filed on Feb. 28, 2007.

(51) Int. Cl.
*H04J 3/02* (2006.01)
(52) U.S. Cl. ........................ 370/465; 370/535
(58) Field of Classification Search ............. 370/465, 370/535
See application file for complete search history.

(56) References Cited

U.S. PATENT DOCUMENTS 7,474,612 B1 * 1/2009 Patel .................... 370/217

2002/0034197 A1    3/2002  Tornetta et al.
2003/0039168 A1 *  2/2003  Chan et al. .............. 365/233
2005/0089126 A1    4/2005  Zerbe et al.
2005/0169585 A1    8/2005  Aronson et al.
2009/0080584 A1 *  3/2009  Hamano et al. .......... 375/371
2009/0207057 A1 *  8/2009  Diab ...................... 341/100

OTHER PUBLICATIONS

SerDes Framer Interface Level5 (SFI-5): Implementation Agreement for 40Gb/s Interface for Physical Layer Devices, OIF-SF15-01.02, Jan. 29, 2002, pp. 8, 17-19.

* cited by examiner

*Primary Examiner*—Melvin Marcelo
(74) *Attorney, Agent, or Firm*—Workman Nydegger

(57) ABSTRACT

A multi-mode SerDes may be implemented in at least two different optoelectronic device architectures. The serializer includes a dual-mode bypass block for allowing data signals to go straight from input nodes to a multiplexing block or for decoding encoded data signals. A final dynamic high speed multiplexer multiplexes two data signals into one serial signal, or allows a single signal to go through. The deserializer includes an input dynamic high speed demultiplexer for demultiplexing one serial signal into two, or for allowing a serial signal through. A dual-mode bypass block is provided to allow data signals to go straight through from a demultiplexing block to output nodes or to encode data signals prior to providing them to the output nodes.

30 Claims, 10 Drawing Sheets

MULTI-MODE INTEGRATED CIRCUIT FOR USE IN OPTOELECTRONIC DEVICES

CROSS-REFERENCE TO RELATED APPLICATIONS

This application claims the benefit of U.S. Provisional Patent Application Ser. No. 60/892,154, filed Feb. 28, 2007, entitled MULTI-MODE INTEGRATED CIRCUIT FOR USE IN OPTOELECTRONIC DEVICES, and U.S. Provisional Patent Application Ser. No. 60/892,132, filed Feb. 28, 2007, entitled MULTI-CHANNEL OPTICAL TRANSCEIVERS WITH MULTI-CHANNEL ELECTRICAL INTERFACE. The foregoing applications are herein incorporated by reference in their entirety.

BACKGROUND OF THE INVENTION

1. The Field of the Invention

The present invention relates generally to the field of high speed data transmission. More particularly, embodiments of the invention relate to systems and methods for serializing and deserializing electrical and/or optical signals in numerous and varied environments to achieve high speed data transmission.

2. The Relevant Technology

Computing and networking technology have transformed our world. As the amount of information communicated over networks has increased, high speed transmission becomes ever more critical. Many high speed data transmission networks rely on optical transceivers and similar optoelectronic devices for facilitating transmission and reception of digital data. Optical networks are thus found in a wide variety of high speed applications ranging from modest Local Area Networks (LANs) to the backbone of the Internet.

Many optoelectronic device architectures use a higher signaling rate and lower signal count to send optical signals over an optical fiber than to receive electrical signals from a line card on which the devices are used. This requires the devices to convert from the higher optical data rate to the lower electrical data rate, and vice versa. The integrated circuit ("IC") component that performs this function is called a serializer/deserializer, also commonly referred to as a SerDes.

The serializer portion of the SerDes receives two or more parallel data signals from a line card at a first signal rate and provides as output one or more serial data signals at a second signal rate. The number of output serial data signals is usually less than the number of input parallel data signals, although the same amount of data is conveyed by the output serial data signals. Consequently, the signal rate of one of the parallel data signals is less than the signal rate of one of the serial data signals.

The deserializer portion of the SerDes performs a function that is the reverse of the function performed by the serializer. The deserializer receives one or more serial data signals at the second signal rate and provides two or more parallel data signals to the line card at the first signal rate.

Typically, a different SerDes is required for different optoelectronic device architectures since the functions performed by the SerDes depend on the device architecture. For instance, a 40 G transponder architecture may implement the SFI5.1 protocol to convert between sixteen parallel data signals at a 2.5 gigabit per second ("G") data rate per signal and one 40 G serial signal. In contrast, a 10 GE transponder architecture may implement the XAUI protocol to convert between four parallel 2.5 G data signals and one 10 G serial signal. Accordingly, a need exists in the art for a multi-mode SerDes which supports operation in different architectures and at increased transmission speeds.

BRIEF SUMMARY OF THE INVENTION

Embodiments of the present invention are directed to systems and methods for serializing and deserializing electrical data signals. In particular, embodiments of the invention enable the use of a multi-mode SerDes, serializer, and/or deserializer in 100 GE mode. In other embodiments, the multi-mode SerDes, serializer, or deserializer can additionally be used in one or more other modes, such as 40 G VSR mode, 43 G transport mode, and 43 G DQPSK mode. In this manner, engineering resources and non-recurring engineering costs are significantly reduced, as compared to developing numerous single-mode serializers and/or deserializers for specific device architectures. Additionally, since one multi-mode serializer and/or deserializer addresses the requirements of multiple single-mode serializer and/or deserializer markets, the resulting higher overall volumes reduce the cost of the IC chip sets and bring in a greater return on research and development investment.

One embodiment of a multi-mode serializer/deserializer ("SerDes") is designed to operate in at least 100 G mode. In 100 G mode, the serializer/deserializer ("SerDes") can convert between 10×10 G, 12×8.33 G or 8×12.5 G parallel data lanes and 4×25 G or 5×20 G serial data lanes. The multi-mode SerDes may additionally operate in one or more other modes. In 40 G VSR mode, the SerDes can convert between 5×10 G encoded parallel data lanes and a 1×40 G serial data lane. In 43 G transport mode, the SerDes can convert between 5×10.75 G encoded parallel data lanes and a 1×43 G serial data lane with a 21.5 gigahertz ("GHz") clock signal. In 43 G DQPSK mode, the SerDes can convert between 5×10.75 G encoded parallel data lanes and 2×21.5 G serial data lanes with a 21.5 GHz clock signal.

In one embodiment of the invention, a multi-mode serializer includes input nodes for receiving parallel data signals, a main multiplexing block for converting the parallel data signals to serial data signals, final retiming flip flops for clocking the serial data signals out of the main multiplexing block, and a dynamic high speed multiplexer for optionally multiplexing two of the serial data signals during 40 G VSR mode and 43 G transport mode into a single serial signal. A dual-mode bypass block between the input nodes and the main multiplexing block optionally converts five encoded parallel data signals to four parallel data signals during operation in 40 G VSR, 43 G transport and 43 G DQPSK modes.

In another embodiment of the invention, a multi-mode deserializer includes input nodes for receiving one or more high speed serial data signals, an input dynamic high speed demultiplexer for optionally demultiplexing one serial data signal during 40 G VSR mode and/or 43 G transport mode into two data signals, initial retiming flip flops, a main demultiplexing block, a dual-mode bypass block and final retiming flip flops. The initial retiming flip flops are used to clock the serial data signals into the main demultiplexing block and the main demultiplexing block converts the serial data signals to parallel data signals. The final retiming flip flops are used to clock the parallel data signals out of the demultiplexing block. The dual-mode bypass block is between the demultiplexing block and the final retiming flip flops and it optionally converts four parallel data signals to five encoded parallel data signals during operation in 40 G VSR, 43 G transport and 43 G DQPSK modes.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
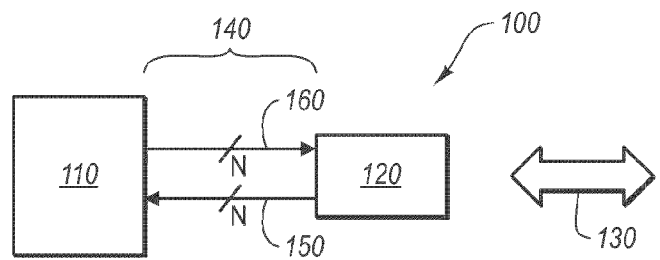
FIG. 1 illustrates an example system architecture in which embodiments of the invention may be practiced.

Reference will now be made to the drawings to describe various aspects of exemplary embodiments of the invention. It should be understood that the drawings are diagrammatic and schematic representations of such exemplary embodiments and, accordingly, are not limiting of the scope of the present invention, nor are the drawings necessarily drawn to scale.

In general, embodiments of the invention are concerned with the serialization and deserialization of electrical and/or optical signals, also referred to herein as data streams, lanes and channels. More particularly, embodiments of the invention enable the use of a multi-mode IC architecture having one or more serializers and/or deserializers that supports operation in two or more different applications, including, but not limited to, 40 G and 100 G optoelectronic devices. Further, some of the examples herein are described with respect to particular interfaces, particular types of light emitters or lasers, and/or with respect to specific data rates. One of skill in the art can appreciate, with the benefit of the present disclosure, that other data rates, lasers, and/or interfaces may be implemented in the architectures described herein.

The present invention can be implemented in various system architectures in which data is transmitted and received, including architectures that include optoelectronic devices. As used herein, the term "optoelectronic device" includes devices having both optical and electrical components. Examples of optoelectronic devices include, but are not limited to transponders, transceivers, transmitters, and/or receivers. The optoelectronic devices can exemplarily be used in telecommunications networks, local area networks, metro area networks, storage area networks, wide area networks, and the like and can be configured to conform with one or more standardized form factors or multi-source agreements (MSAs). It will be appreciated, however, that the optoelectronic devices need not comply with standardized form factor requirements and may have any size or configuration necessary according to a particular design.

The principles of the present invention may be implemented in optoelectronic devices of any form factor currently available or that may be developed in the future for 40 G, 43 G and/or 100 G signaling, without restriction. As used herein, the terms "40 G", "43 G", and "100 G" are rounded approximations of signaling rates and have the meanings commonly understood by those of skill in the art. In particular, the terms 40 G, 43 G, and 100 G refer to data rates substantially equal to 40 G, 43 G, and 100 G, respectively. For instance, the term "40 G" may be understood to refer to 39.813 gigabits per second, the term "43 G" may be understood to refer to 43.108 gigabits per second, and the term "100 G" may be understood to refer to 103.125 gigabits per second. Other terms applied to signaling rates described herein include 21.5 G, 10 G, 12.5, 8.33 G, and the like. These terms similarly have the meanings commonly understood by those of skill in the art.

I. Example Operating Environment

FIG. 1 illustrates an example system architecture 100 in which embodiments of the invention may be implemented. The system 100 facilitates bidirectional (e.g., duplex) communication (optical and/or electrical) between a host device 110, such as a media access controller ("MAC"), and an optoelectronic device 120, such as an optical transceiver or transponder. Additionally, the system 100 facilitates multi-channel or single channel bidirectional optical communication over the duplex fibers 130. However, the principles of the present invention are equally applicable in unidirectional (e.g., simplex) systems. Embodiments of the invention can be implemented in optoelectronic devices utilizing various multi-channel optical transmission techniques, including wavelength division multiplexing ("WDM"), parallel optics and in-phase and quadrature-phase ("I and Q") channels.

In this example, an electrical interface 140 between the host device 110 and the device 120 is provided for conveying data between the host and the device. The electrical interface 140 includes a plurality of receive lanes 150, the number of receive lanes represented by the letter "N," and an equivalent number of transmit lanes 160. In other words, the electrical interface includes N I/O electrical lanes. The number of lanes and the data rate per lane determines the aggregate data rate. In one embodiment of the invention, a 100 G aggregate data rate (in each direction) is achieved with ten I/O lanes operating at 10 G per lane, or 10×10 G I/O lanes. A 100 G aggregate data rate may also be achieved with 12×8.33 G I/O lanes, 8×12.5 G I/O lanes, or numerous other configurations. In another embodiment of the invention, a 40 G aggregate data rate is achieved with 5×10 G I/O lanes (four data lanes and a fifth deskew lane carrying redundant data). In yet another embodiment of the invention, a 43 G aggregate data rate is achieved with 5×10.75 G I/O lanes (four data lanes and a fifth deskew lane carrying redundant data). Of course, other configurations for the electrical interface 140 may alternately or additionally be implemented.

In operation, the device 120 receives N transmit signals 160 from the host device 110 and emits one or more optical signals representative of the N transmit signals onto duplex optical fibers 130. The device 120 can also receive one or more optical signals from the duplex optical fibers 130 and provide to the host device 110 N receive signals 150 representative of the received optical signals.

In various embodiments of the invention, there are fewer optical signals than electrical signals (both transmit and receive) carrying an equivalent amount of data. Consequently, the optical signals have a higher data rate than the electrical signals and the device 120 includes one or more SerDes ICs to convert between the two data rates. Embodiments of the invention contemplate a multi-mode SerDes IC that supports operation in at least two different modes, such as 100 G mode (e.g., in devices with 100 G electrical I/O), 40 G mode and 43 G mode.

II. Example Optoelectronic Devices

Figure 2:
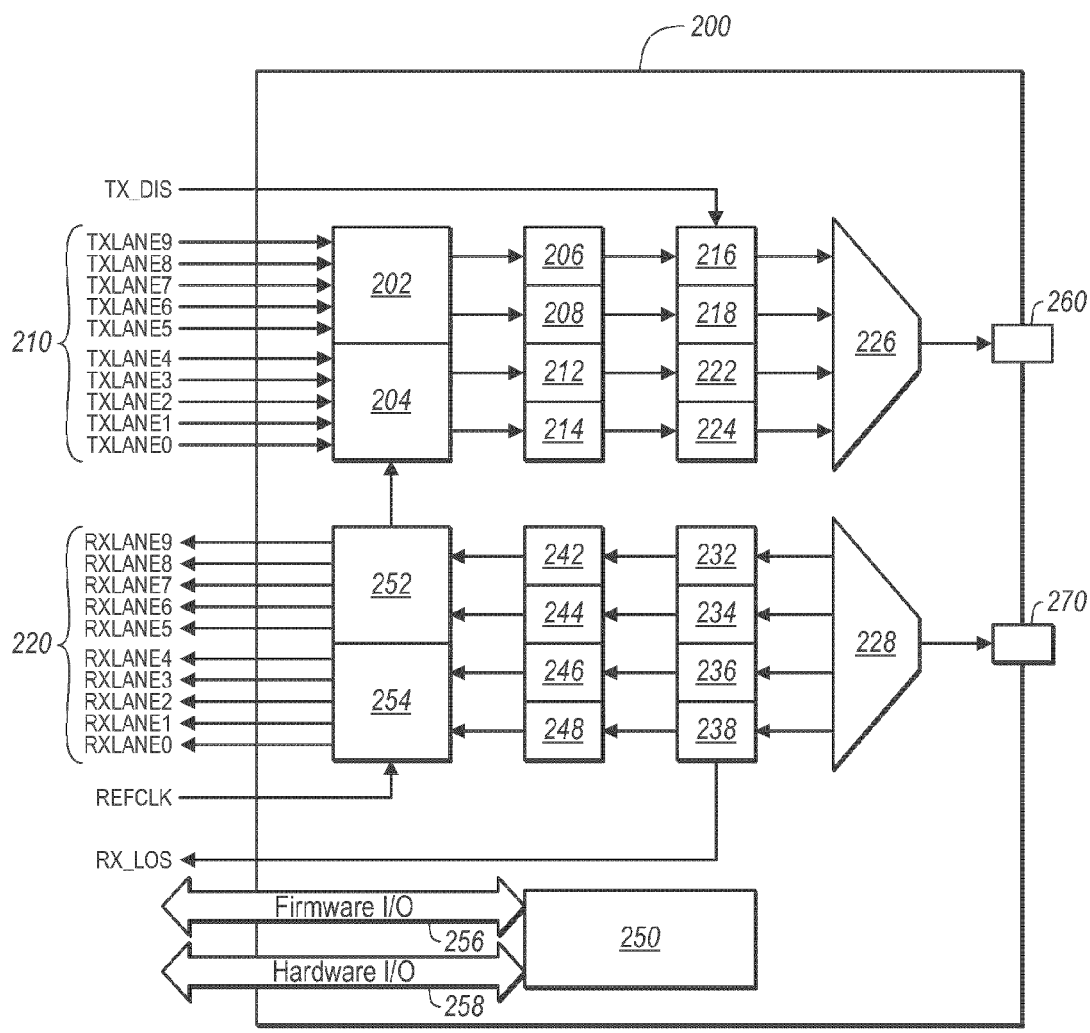
FIG. 2 illustrates one embodiment of a 100 G device architecture in which embodiments of the invention may be implemented.

FIG. 2 illustrates an example multi-channel optoelectronic device 200 in which embodiments of a multi-mode SerDes IC may be implemented. As used herein, the term "multi-channel" as applied to an optoelectronic device refers to a device with multiple bidirectional or unidirectional optical channels. While the module 200 will be described in some detail, the module 200 is described by way of illustration only, and not by way of restricting the scope of the invention. In particular, some of the components used to facilitate one type of multi-channel transmission technique may or may not be necessary in another type of multi-channel transmission technique. For instance, in the present embodiment, the device 200 implements some form of wavelength division multiplexing ("WDM") to transmit and receive multiple optical data channels over optical fiber 260, 270, requiring an optical multiplexer ("MUX") for transmission and an optical demultiplexer ("DEMUX") for reception of optical signals. However, the invention may also be utilized in multi-channel optoelectronic devices implementing other multi-channel transmission techniques, such as parallel optics and quadrature multiplexing, including differential quadrature phase shift keying ("DQPSK"). Additionally, the invention may be implemented in single-channel optoelectronic devices. Thus, the fiber optic cables 260, 270 may comprise single mode fiber ("SMF"), multimode optical fibers ("MMF"), parallel ribbon fibers, and the like or any combination thereof.

The module 200 includes a 100 G electrical interface for receiving 10×10 G transmit data channels 210 (TXLANE0-TXLANE9) from a host and for providing 10×10 G receive data channels 220 (RXLANE0-RXLANE9) to the host. During operation, the module 200 can receive the 10×10 G transmit data channels 210 for transmission as a single multiplexed data-carrying optical signal onto the optical fiber 260. While referred to as a "single multiplexed data carrying optical signal," those skilled in the art will recognize that the optical signal emitted onto the optical fiber 260 may include multiple wavelength channels, each channel carrying a portion of the 100 G aggregate transmit data. In the present embodiment, four wavelength channels at a 25 G per channel data rate carry the 100 G aggregate transmit data. In other embodiments, however, five wavelength channels at a 20 G per channel data rate could carry the 100 G aggregate transmit data. Yet another approach is to use ten wavelength channels at a 10 G per channel data rate.

The device 200 includes a plurality of serializers 202 and 204 which perform a variety of functions. In this example, there are two 5:2 serializers, at least one of which is a multi-mode serializer, described in more detail below. The serializers 202 and 204 receive the 10×10 G data lanes from the host and generate 4×25 G data lanes. In other words, each serializer receives five 10 G data lanes and generates two re-clocked 25 G lanes. Each serializer 202, 204 may be implemented individually on separate ICs, as shown in FIG. 2. Alternately or additionally, both serializers 202, 204 can be combined into a single IC. Alternately or additionally, one or both of the serializers 202, 204 can be combined into a single IC with one or more deserializers or other components.

Returning to FIG. 2, after the ten electrical signals 210 have been serialized into four 25 G electrical signals, the four electrical signals are provided to four modulation drivers 206, 208, 212 and 214, which drive four electro-optical transducers 216, 218, 222 and 224 to emit four optical signals representative of the information carried in the four 25 G electrical signals. Each of the four electro-optical transducers comprises a light source having any suitable configuration, including, but not limited to, a distributed feedback ("DFB") laser, a vertical cavity surface emitting laser ("VCSEL"), a cooled or uncooled externally modulated laser ("EML"), an EML with a wavelocker, a Fabry-Perot laser, a light emitting diode ("LED"), and the like. In the present embodiment, the four electro-optical transducers 216, 218, 222 and 224 comprise four EMLs packaged as a single component, although other arrangements, light sources and materials may also be used.

Because the present embodiment implements WDM, the four optical signals emitted by the transducers 216, 218, 222 and 224 each occupy a distinct wavelength channel. In one embodiment, the wavelengths may be chosen from the 200 GHz dense WDM ("DWDM") grid specified by Recommendation G.694.1 of the International Telecommunication Union Telecommunication Standardization Sector ("ITU-T"), and the transducers 216, 218, 222 and 224 are configured to emit optical signals at the chosen wavelengths. The electro-optical transducers 216, 218, 222 and 224 are coupled to a DWDM MUX 226 and the four 25 G optical signals emitted by the transducers 216, 218, 222 and 224 are optically multiplexed into a single 100 G multiplexed optical signal and transmitted over the optical fiber 260. Those skilled in the art will recognize that other configurations may be implemented. For instance, the electro-optical transducers may comprise an array of cooled or un-cooled DMLs configured to emit optical signals chosen from the 20 nm coarse WDM ("CWDM") grid specified by ITU-T G.694.2. In this case, the DML array would be coupled to a CWDM MUX and the optical channels would also be multiplexed and transmitted over optical fiber 260.

The multi-channel optoelectronic device 200 is also configured to receive a single 100 G optically multiplexed signal from the optical fiber 270. A received optically multiplexed signal passes through an optical DEMUX 228 which performs the inverse of the MUX 226. In the present embodiment, the DEMUX comprises a 1:4 optical DEMUX, which means a 100 G multiplexed optical signal passing through the DEMUX 228 is separated into four individual 25 G optical signals, each of the four signals occupying a distinct wavelength channel.

The four 25 G optical signals received from the DEMUX 228 are provided to four opto-electrical transducers 232, 234, 236 and 238 which transform the 25 G optical signals into 25 G electrical signals. Each of the opto-electrical transducers 232, 234, 236 and 238 comprises a photodetector such as a photodiode, an avalanche photodiode (APD), a positive-intrinsic-negative photodiode (PIN), and the like. In the present embodiment, the four opto-electrical transducers 232, 234, 236 and 238 comprise an array of four PINs fabricated on a single piece of Indium Phosphide, although other arrangements, transducers and materials may also be used.

The four 25 G electrical signals produced by the opto-electrical transducers 232, 234, 236 and 238 are provided to four post-amplifiers 242, 244, 246 and 248 which amplify each 25 G electrical signal. The four amplified 25 G electrical signals are provided to two deserializers 252 and 254, each deserializer 252 and 254 receiving two amplified 25 G electrical signals and generating five re-clocked 10 G electrical signals. The resulting 10×10 G data lanes 220 are provided to the host. As with the serializers 202, 204, each deserializer 252, 254 may be implemented individually on separate ICs, as shown in FIG. 2. Alternately or additionally, both deserializers 252, 254 can be combined into a single IC. Alternately or additionally, one or both of the deserializers 252, 254 can be combined into a single IC with one or more serializers 202, 204, and/or other components.

Finally, the module 200 may also include a micro-controller 250. The micro-controller 250 may be used in a number of ways, including optimizing the dynamically varying performance of the optoelectronic device 200 by, for instance, adjusting settings on each of the drivers 206, 208, 212 and 214 and/or post-amplifiers 242, 244, 246 and 248. Various interfaces, such as an I$^2$C interface 256 and hardware I/O 258 may permit the micro-controller to communicate directly with a host and/or hardware components within the optoelectronic device 200.

Figure 3:
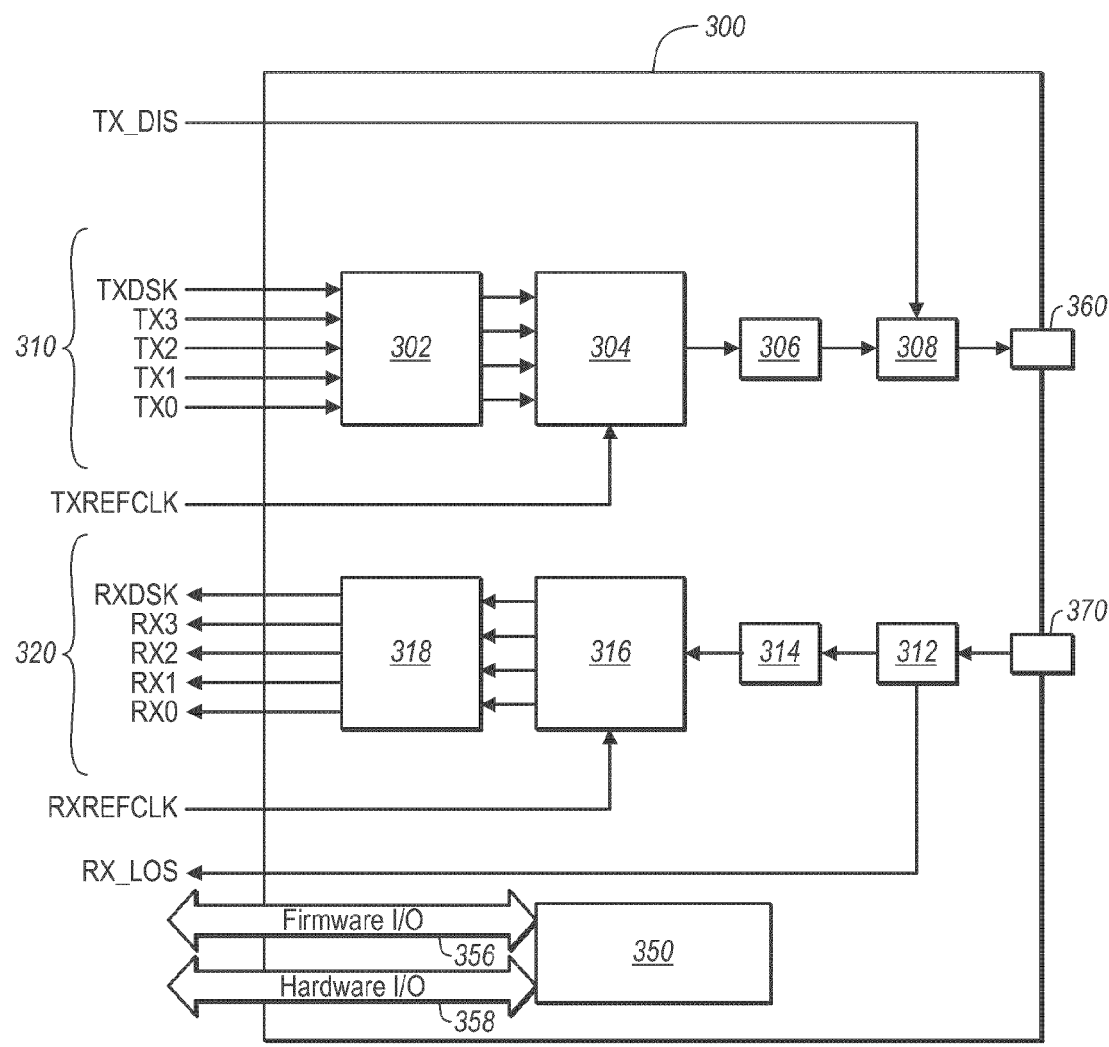
FIG. 3 illustrates one embodiment of a 40 G VSR device architecture in which embodiments of the invention may be implemented.

FIG. 3 illustrates an example single-channel optoelectronic device 300 in which embodiments of a multi-mode SerDes IC may be implemented. The device 300 can achieve an aggregate bidirectional data rate of 40 G by converting 5×10 G transmit channels 310 (including 4 data lanes and a fifth deskew lane) from a host into a single 40 G transmit optical signal and providing 5×10 G receive data channels 320 (including data lanes and a fifth deskew lane) to the host from a single 40 G receive optical signal. The device 300 may be referred to as a 40 G client or VSR optoelectronic device or a 40 G application.

In this example, the 5×10 G transmit channels are received by an SFI5.2 receiver 302 complying with the SFI5.2 interface standard. The SFI5.2 receiver 302 uses data from the fifth deskew lane to properly byte align the four data channels and convert between the 5×10 G receive data channels 310 to four receive channels which are provided to a serializer 304. In one embodiment, the SFI5.2 receiver 302 and serializer 304 may correspond to the serializer 202 of FIG. 2. Similar to the serializers 202 and 204 of FIG. 2, the serializer 304 receives multiple data lanes at a relatively slow data rate and generates a fewer number of data lanes at a relatively fast data rate. In this example, the serializer 304 receives four 10 G data lanes from the SFI5.2 receiver 302 and generates a single re-clocked 40 G data lane. Of course, other transmission rates may also be achieved including by way of example and not limitation, 100 G.

The single 40 G serialized electrical signal is provided to a modulation driver 306 which drives an electro-optical transducer 308 to emit a 40 G transmit optical signal representative of the information carried on the 40 G serialized signal. In the present embodiment, the electro-optical transducer 308 may include an EML or other type of laser or light emitter. The 40 G transmit optical signal may be emitted onto optical fiber 360 or other type of fiber.

The single-channel device 300 is also configured to receive a 40 G receive optical signal from optical fiber 370. The 40 G receive optical signal is provided to an opto-electrical transducer 312 which transforms the 40 G receive optical signal into a 40 G electrical data lane. A post amplifier 314 amplifies the 40 G electrical data lane from the transducer 312 and provides an amplified 40 G data lane to a deserializer 316.

Similar to the deserializers 252 and 254 of FIG. 2, the deserializer 316 receives one or more data lanes at a fast data rate and generates a greater number of data lanes at a slow data rate. In particular, the deserializer 316 receives a single 40 G data lane from the post amplifier 314 and generates four re-clocked 10 G data lanes. The four re-clocked 10 G data lanes are provided to an SFI5.2 transmit block 318 complying with the SFI5.2 interface standard. The SFI5.2 transmit block may perform encoding on the 4×10 G channels and provide five 10 G receive data channels 320 (four data channels plus a fifth deskew channel) to the host. In one embodiment, the deserializer 316 and SFI5.2 transmit block 318 correspond to the deserializer 252 of FIG. 2.

The module 300 may additionally include a microcontroller 350 with an I$^2$C or other host interface 356 and hardware I/O 358.

Figure 4:
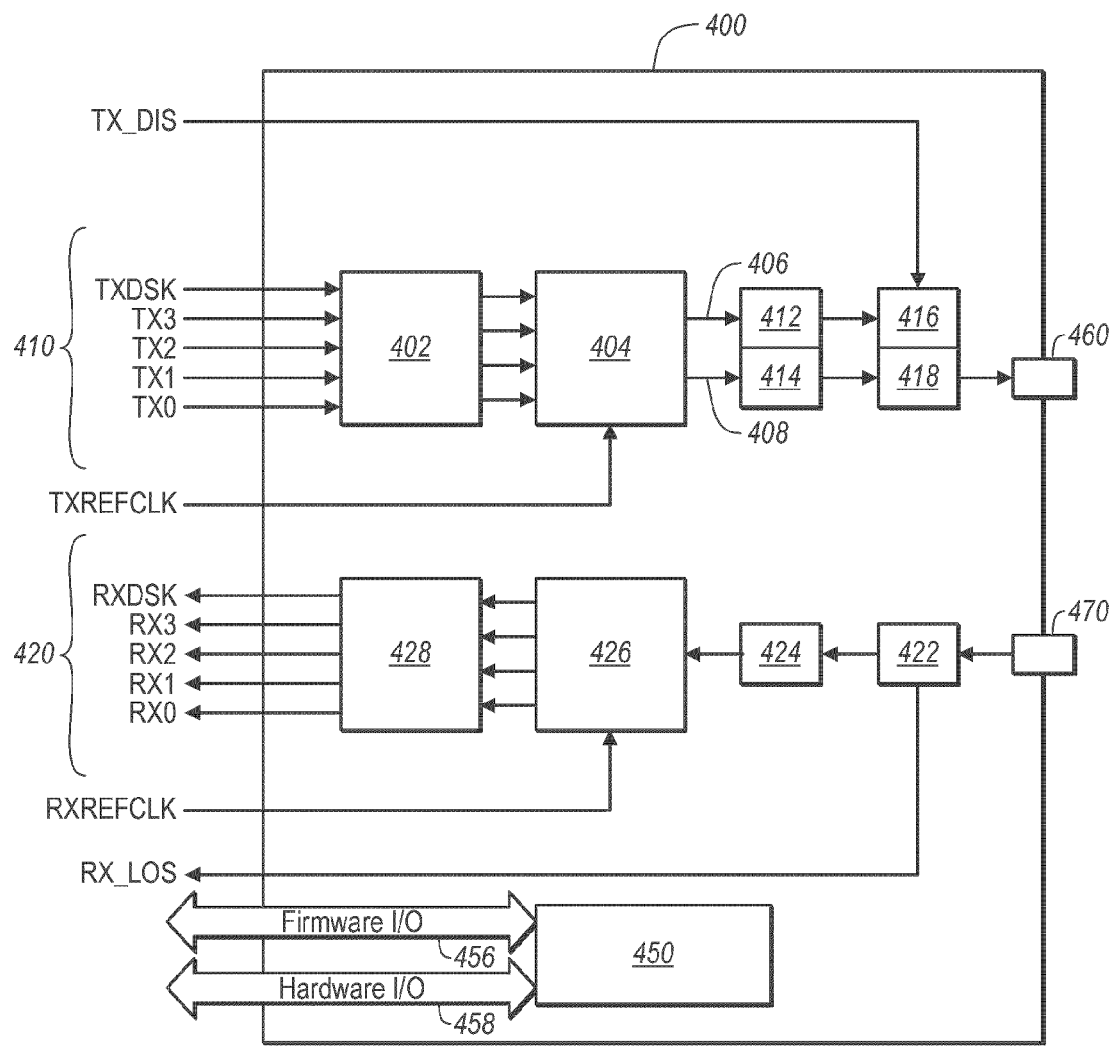
FIG. 4 illustrates one embodiment of a 43 G transport device architecture in which embodiments of the invention may be implemented.

FIG. 4 illustrates a second example single-channel optoelectronic device 400 in which embodiments of a multi-mode SerDes IC may be implemented. The device 400 is similar to the device 300 except that it can achieve an aggregate bidirectional data rate of 43 G by receiving 5×10.75 G transmit channels 410 (including 4 data lanes and a fifth deskew lane) from a host and providing 5×10.75 G receive data channels 420 (including four data lanes and a fifth deskew lane) to the host. The device 400 may be referred to as a 43 G transport application and may implement a differential phase shift keying ("DPSK") modulation format to optically transmit data.

The device 400 includes a receiver 402 similar to the receiver 302 of FIG. 3 which receives the 5×10.75 G transmit channels 410 from the host and uses data on a deskew lane to properly byte align four data channels and convert between the 5×10.75 G transmit data channels 410 to four transmit channels which are provided to a serializer 404. The serializer 404 receives four 10.75 G data lanes from the SFI5.2 receiver 402 and generates a re-clocked 43 G data lane 406 and a 21.5 GHz clock 408 which is used in a later stage of modulation. Similar to FIG. 3, the receiver 402 and serializer 404 may correspond in one embodiment to the serializer 202 of FIG. 2

The 43 G signal 406 and the 21.5 GHz clock are provided to two drivers 412 and 414 which drive two Mach-Zehnder modulated lasers ("MZMLs") to emit a single 43 G optical signal representative of the data carried on the 43 G electrical signal 406 onto the optical fiber 460.

The device 400 can also receive a 43 G optical signal using a similar architecture as the device 300 of FIG. 3. The device 400 receives a 43 G optical signal from the optical fiber 470 and converts it to a 43 G electrical signal with an opto-electrical transducer 422. The 43 G electrical signal is amplified by a post-amplifier 424, which may include a transimpedance amplifier and/or a limiting amplifier in one embodiment. An amplified 43 G signal is provided to a deserializer 426 which generates four re-clocked 10.75 G lanes. The four re-clocked 10.75 G lanes are provided to an SFI5.2 transmit block 428 which may perform encoding and convert the four 10.75 G lanes to five 10.75 G lanes which are provided to the host. Similar to FIG. 3, the deserializer 426 and SFI5.2 transmit block 428 may correspond in one embodiment to the deserializer 252 of FIG. 2.

Figure 5:
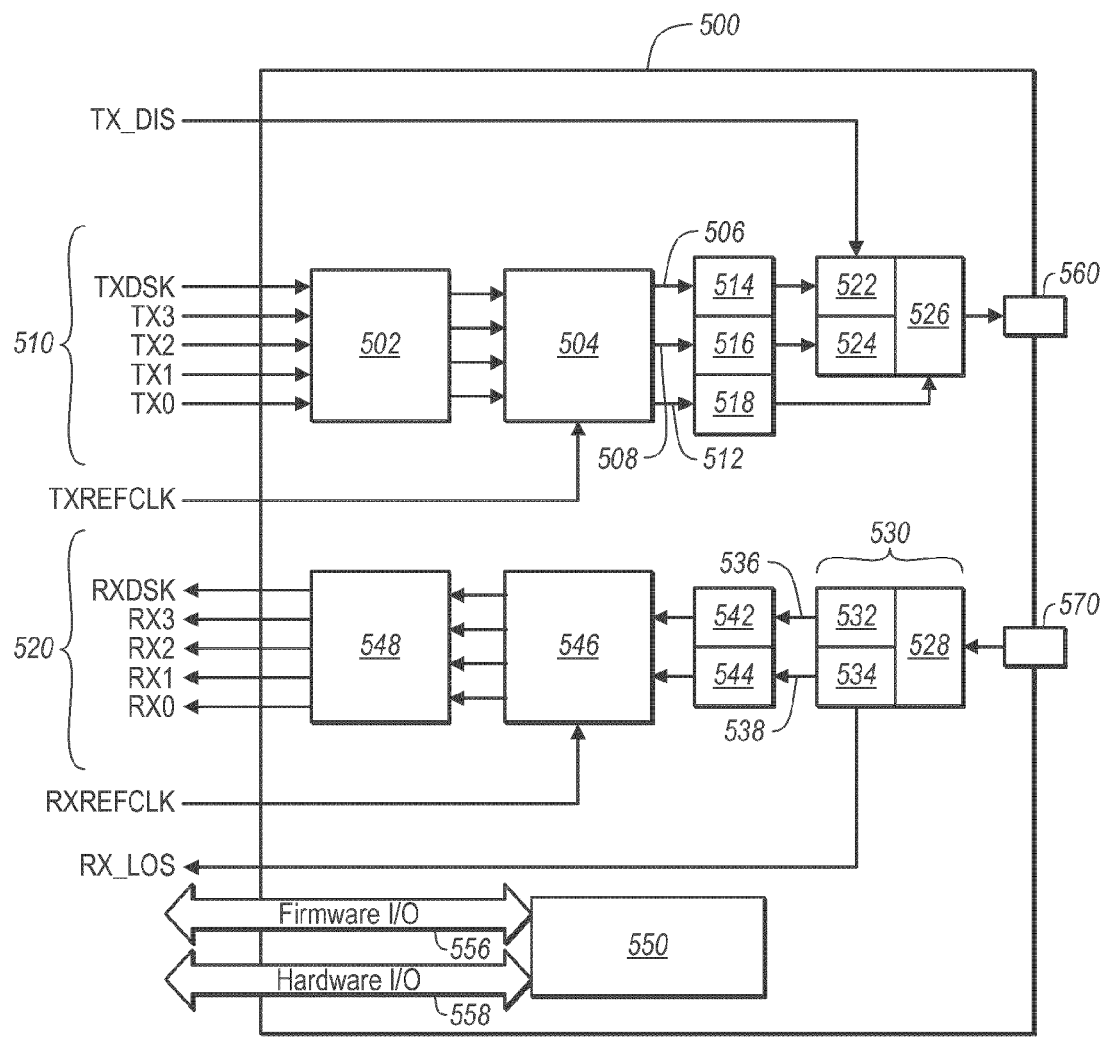
FIG. 5 illustrates one embodiment of a 43 G DQPSK device architecture in which embodiments of the invention may be implemented.

FIG. 5 illustrates a third example single-channel optoelectronic device 500 in which embodiments of a multi-mode SerDes IC may be implemented. The device may implement a differential quadrature phase shift keying ("DQPSK") modulation format and may be referred to as a 43 G DQPSK optoelectronic device or application. The device 500 is similar to the device 400 of FIG. 4 in both its 43 G optical data rate and electrical interface with a host.

In particular, an SFI5.2 receiver 502 converts 5×10.75 G transmit channels into 4×10.75 G transmit channels which are provided to a serializer 504. Ultimately, the device 500 emits a single 43 G optical signal on an optical fiber 560, the 43 G optical signal being representative of the data received from the host. Similarly, the device 500 can receive a 43 G optical signal from an optical fiber 570 which is ultimately split into 4×10.75 G receive channels by a deserializer 546 and converted by an SFI5.2 transmitter 548 into 5×10.75 G receive channels 520 which are provided to the host. The receiver 502 and serializer 504 may correspond in one embodiment to the serializer 202 of FIG. 2. The deserializer 546 and transmitter 548 may correspond in one embodiment to the deserializer 252 of FIG. 2.

Returning to FIG. 5, the four 10.75 G transmit channels received by the serializer 504 are used to generate two 21.5 G transmit channels 506 and 508 and a 21.5 GHz clock 512. The two 21.5 G channels 506 and 508 and the 21.5 G clock 512 are used by three modulation drivers 514, 516 and 518 to drive two MZMLs 522 and 524 and a modelocked laser ("ML") 526 to emit a single 43 G optical signal onto the optical fiber 560.

On the receive side, a single 43 G optical signal is received from the optical fiber 570 by a receive block 530 including a Mach-Zehnder delay interferometer ("MZDI") 528 and two photodetectors 532 and 534. The receive block 530 generates two 21.5 G electrical signals 536 and 538 which are provided to two post-amplifiers 542 544, each post-amplifier including in some embodiments a transimpedance amplifier and/or a limiting amplifier. The post-amplifiers 542 and 544 provide two amplified 21.5 G data channels to the deserializer 546, which uses the two 21.5 G data channels to generate four re-clocked 10.75 G data channels, which are provided to the SFI5.2 transmitter 548 and processed as previously described.

III. Multi-Mode Serializer

Figure 6A:
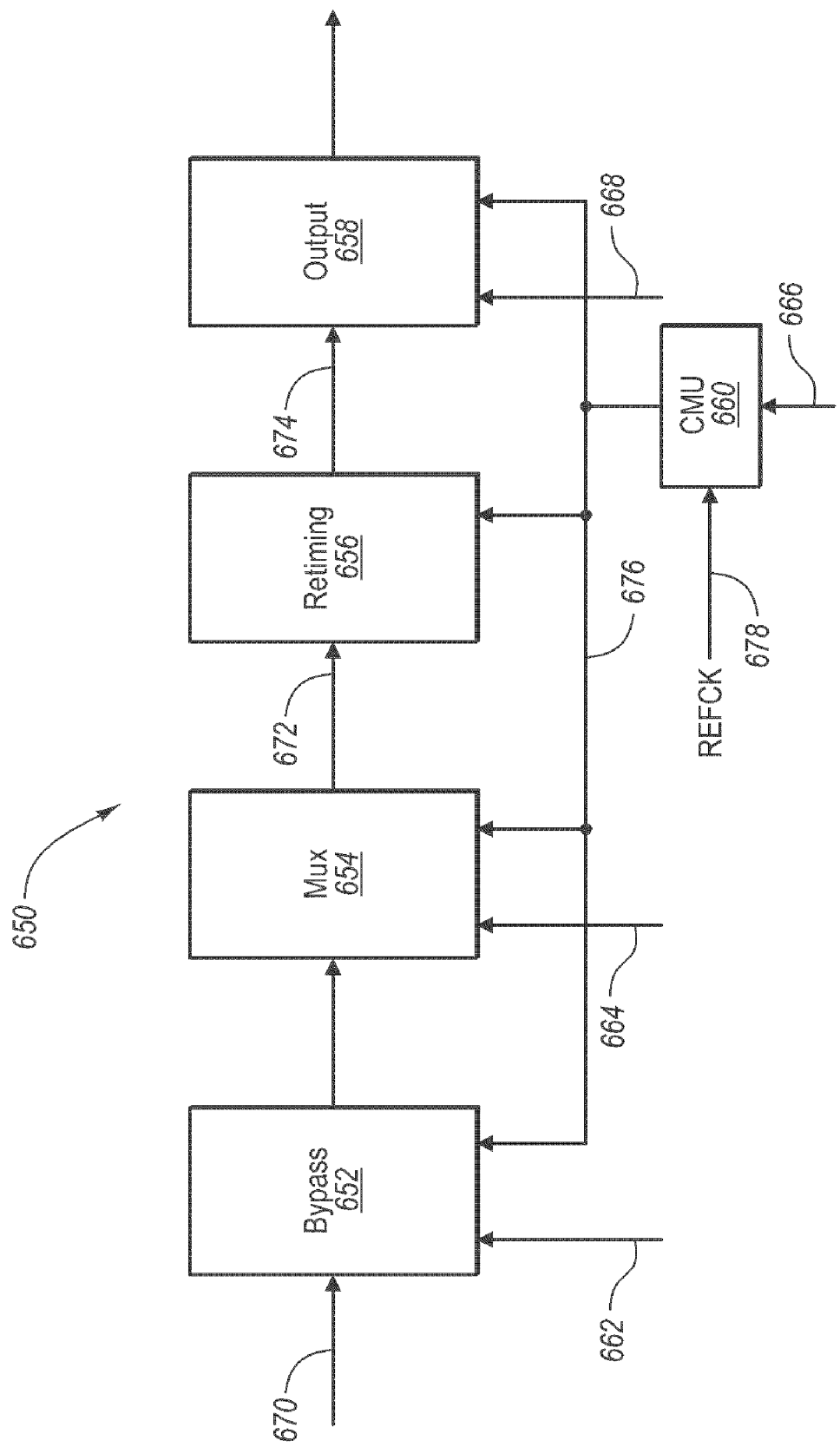
FIG. 6A illustrates a simplified block view of one embodiment of a multi-mode serializer.
Figure 6B:
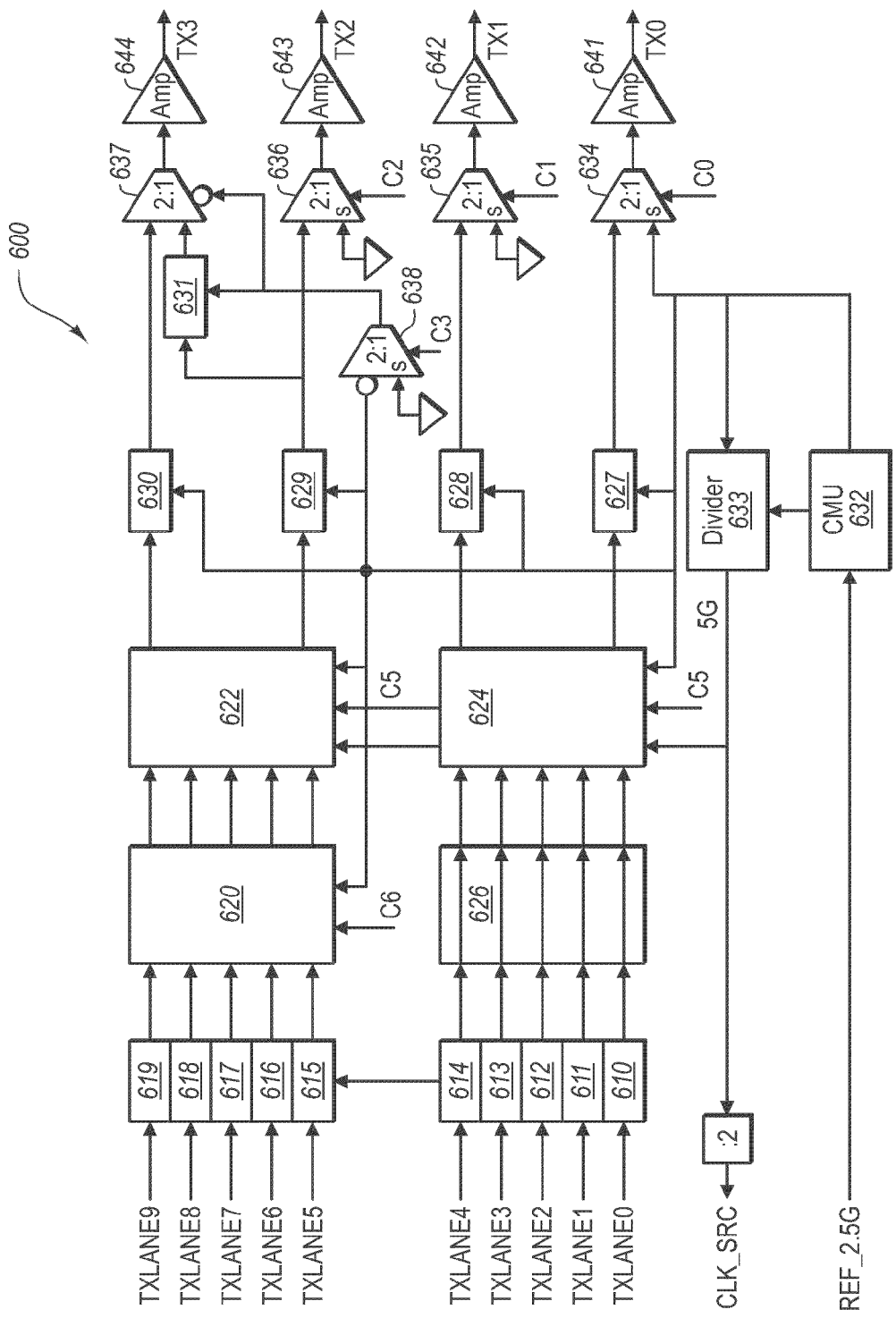
FIG. 6B illustrates one embodiment of the multi-mode serializer of FIG. 6A.

Now with regard to FIGS. 6A and 6B, a multi-mode serializer 650, 600 is described which may be implemented in the device architectures 200, 300, 400 and 500 of FIGS. 2-5. Specifically, the multi-mode serializer 650, 600 may correspond to one or more of the serializers 202 and 204 of FIG. 2, the SFI5.2 receiver 302 and serializer 304 of FIG. 3, the SFI5.2 receiver 402 and serializer 404 of FIG. 4 and the SFI5.2 receiver 502 and serializer 504 of FIG. 5. As will be described, the multi-mode serializer may operate in at least two of 100 G mode (e.g., in a 100 GE application), 40 G VSR mode, 43 G transport mode and 43 G DQPSK mode or other modes.

In particular, FIG. 6A illustrates a simplified block view of one embodiment of a multi-mode serializer 650. The multi-mode serializer 650 is designed to accept any number of transmit signals with many different aggregate data rates, so that it may be used in the architectures 200, 300, 400 and 500 already described as well as in other architectures. Accordingly, the multi-mode serializer 650 includes a bypass stage 652 for accepting a plurality of transmit signals, a multiplexing stage 654, a retiming stage 656, an output stage 658 and a clock multiplier unit (CMU) 660. Some of these components perform different functions depending, for instance, on the aggregate data rate of the transmit signals and the particular application in which the multi-mode serializer 650 is implemented. Mode-selection signals 662, 664, 666 and 668 may be provided by, for example, a micro-controller to instruct each component what function to perform.

In the present example, the bypass stage 662 can accept a plurality of transmit signals 670 and either pass the transmit signals 670 directly through to the multiplexer stage 654 or decode the transmit signals. When the aggregate data rate of the transmit signals is 100 G as in FIG. 2, the bypass stage 652 can pass 10×10 G transmit signals directly through to the multiplexer stage 654, which may perform a 10:4 multiplex operation to generate 4×25 G multiplexed signals 672 from the 10×10 G transmit signals 670. Alternately, when the aggregate data rate of the transmit signals is 40 G or 43 G, the bypass stage 652 can decode 5×10 G (or 10.75 G) transmit signals 670 into 4×10 G (or 10.75 G) transmit signals before providing the four transmit signals to the multiplexer stage 654, which may perform a 4:2 multiplex operation to generate 2×20 G (or 21.5 G) multiplexed signals 672.

The multiplexed signals 672 can be clocked out of the multiplexer stage 654 into the retiming stage 656, which then provides retimed multiplexed signals 674 to the output stage 658. A high speed clock signal 676 may be generated by the CMU 660 for processing the transmit signals (e.g., clocking signals in and out of a stage), and may be based on a reference clock signal 678. The CMU 660 generates a high-speed clock signal by multiplying up the reference clock signal. The multiplication operation performed by the CMU may depend on the aggregate data rate of the transmit signals. In the present example, a 2.5 GHz reference clock is multiplied in the CMU 660 by ten to obtain a 25 GHz high-speed clock when the aggregate data rate of the transmit signals is 100 G. However, when the aggregate data rate of the transmit signals is 40 G, the CMU 660 may multiply the 2.5 GHz reference clock by eight to obtain a 20 GHz high-speed clock.

The retimed multiplexed signals 674 are then provided to the output stage 658, which can provide the retimed multiplexed signals to transmit optics (not shown) within an optoelectronic device. As with the bypass stage 652, the multiplexing stage 654, and the CMU 660, the function performed by the output stage 658 may depend on the aggregate data rate of the transmit signals. When the aggregate data rate is 100 G or 43 G DQPSK, the retimed multiplexed signals 674 may pass through the output stage 658 unchanged and be provided to the transmit optics. For 40 G and 43 G transport data rates, the retimed multiplexed signals 674 may be multiplexed into a single serial signal before being provided to the transmit optics. Additionally, for 43 G transport and 43 G DQPSK data rates, a 21.5 GHz clock signal generated by the CMU 660 may additionally be provided by the output stage 658 to the transmit optics. To accomplish these different functions, the output stage can include a final dynamic high-speed multiplexer and a plurality of path selectors, such as static multiplexers, as will be described more fully with respect to FIG. 6B.

The multi-mode serializer 650 of FIG. 6A can be implemented in a single IC. Alternately or additionally, it can be separated across multiple ICs. When combined in a single IC, it may correspond to an IC that includes both of serializers 202 and 204 of FIG. 2. When separated across multiple ICs, it may correspond to two ICs, one that includes serializer 202 and another that includes serializer 204, with each of the separate ICs including its own CMU.

Turning now to FIG. 6B, a specific embodiment 600 of the example multi-mode serializer 650 of FIG. 6A is schematically illustrated. The multi-mode serializer 600 includes a plurality of input nodes 610-619 for receiving input data channels from the host. Each node may be configured to receive a single channel. For instance, in 100 G mode, all ten input nodes 610-619 receive a 10 G signal, while in 40 G VSR, 43 G transport and 43 G DQPSK modes, only input nodes 615-619 receive a 10 G or 10.75 G signal. Each input node 610-619 may also include a delay lock loop ("DLL") and/or a clock and data recovery circuit ("CDR") for recovering the input data lanes.

The output of input nodes 615-619 is coupled to a dual-mode bypass block 620 and the output of the dual-mode bypass block is coupled to a main multiplexing block 622. Note that, as used herein, "coupled to" is defined to mean both a direct connection between two or more circuit objects without any intervening circuit objects and an indirect connection between two or more circuit objects with one or more intervening circuit objects. For example, two circuit objects directly connected to each other are "coupled to" one another. The same two circuit objects would also be "coupled to" each other if there were one or more intervening circuit objects connected between them.

When operating in 100 G mode, the dual-mode bypass block 620 allows the data lanes from input nodes 615-619 to pass straight through to the main multiplexing block 622. However, in 40 G VSR, 43 G transport and/or 43 G DQPSK, the dual-mode bypass block 620 operates as an SFI5.2 receiver. In other words, 5×10 G (or 5×10.75 G) data lanes are decoded by the dual-mode bypass block 622 into 4×10 G (or 4×10.75 G) data lanes which are provided to the main multiplexing block 622.

The output of input nodes 610-614 is coupled to the input of a second main multiplexing block 624. There may optionally be a bypass block 626 coupled to the output of the input nodes 610-614 and the input of the second main multiplexing block 624. However, the purpose of the bypass block 626 is to allow the data lanes from the input nodes 610-614 to pass straight through to the second main multiplexing block 624, and as such need not be included. The input nodes 610-614 each receive a data lane when operating in 100 G mode and are unused when operating in the 40 G and 43 G modes.

The main multiplexing block 622 is a dual-mode main multiplexing block, the structure of which will be described more fully with respect to FIG. 7. In the present embodiment, the dual-mode multiplexer 622 may perform a 5:2 or a 4:2 mux function depending on its mode of operation. When operating in 100 G mode, the dual-mode main multiplexing block 622 performs a 5:2 mux on the five data lanes received from the input nodes 615-619, generating two re-clocked 25 G data lanes from five 10 G data lanes. However, when operating in 40 G or 43 G modes, the dual-mode multiplexer 622 receives four 10 G (or 10.75 G) data lanes from the SFI5.2 receiver 620 and performs a 4:2 mux function thereon to generate two re-clocked 20 G (or 21.5 G) data lanes.

The main multiplexing block 624 may be a dual-mode multiplexing block similar to the dual-mode multiplexer 622. However, the block 624 may also be a single-mode 5:2 multiplexing block for generating two re-clocked 25 G data lanes from the 5×10 G data lanes received at input nodes 610-614. Using a dual-mode multiplexer for main block 624 may enable certain test features which may be desirable for improving performance, although it is not required since the main block 624 only performs a 5:2 mux function during normal operation.

When operating in 100 G mode, the four 25 G signals generated by the main multiplexing blocks 622 and 624 are clocked out of the multiplexing blocks using four final flip flops 627-630. When operating in the 40 G or 43 G modes, the two 20 G or 21.5 G signals generated by the main multiplexing block 622 are clocked out of the multiplexing block 622 using two final flip flops 629 and 630. In the 100 G case, a 25 GHz clock supplied by a common CMU 632 is shared by all four final flip flops 627-630. In the 40 G and 43 G cases, a 20 GHz or 21.5 GHz clock is supplied by the CMU 632 and shared by the two final flip flops 629 and 630.

The CMU 632 takes a lower clock reference, for example a 622 MHz or 2.5 GHz clock, and multiplies it up in frequency using a phase-locked loop ("PLL") to achieve the desired frequency (e.g., 20 GHz, 21.5 GHz or 25 GHz). When using a 2.5 GHz reference clock, the CMU 632 multiplies by ten for 100 G mode or by 8 for 40 G mode. A slight extension of the frequency range may be implemented, for instance, by an additional CMU oscillation section in order to obtain the 21.5 GHz clock required for the 43 G modes. There may also be a programmable divider 633 coupled to the CMU 632 used to provide divided versions of the clock signal generated by the CMU 632 to flip flops within the main multiplexing blocks 622 and 624 and to the input nodes 610-619. Advantageously, the CMU 632 is shared by both of the main multiplexing blocks 622 and 624, thereby reducing the cost and footprint of the multi-mode serializer 600.

Coupled to the outputs of the four final retiming flip flops 627-630 are four 2:1 multiplexers 634-637. The first three multiplexers 634-636 are static multiplexers, meaning they act only as path selectors. The fourth multiplexer 637 is a final dynamic high-speed multiplexer. Four output driver amps 641-644 are coupled to the output of the four multiplexers 634-637. In 100 G mode, the four 25 G data lanes clocked into each of the final high speed flips flops 627-630 are used directly by the output driver amps 641-644 and provided to transmitter optics (e.g., modulation drivers, electro-optical transducers), which are not shown in FIG. 6B. This architecture is known as full-rate architecture.

In 40 G VSR (or 43 G transport) mode, two 20 G (or 21.5 G) data lanes are clocked into the final flip flops 629 and 630. The path selector 636 directs data from the final flip flop 629 to a fifth final flip flop 631. The 20 G (or 21.5 G) data lanes from the final flip flops 630 and 631 are multiplexed into a single 40 G (or 43 G) signal by the final dynamic high speed multiplexer 637. A 20 GHz (or 21.5 GHz) clock can be provided to the final flip flop 631 via a fifth path selector 638. The 20 GHz (or 21.5 GHz) clock can also be used to switch the dynamic multiplexer 637 to provide the 40 G (or 43 G) output data lane. This is known as half-rate architecture. The 40 G (or 43.5 G) output from the final dynamic multiplexer 637 is provided to the output driver 644, which provides a 40 G (or 43.5 G) signal to the transmitter optics (not shown).

The final dynamic multiplexer 637 and driver amp 644 are designed to have up to 43 G bandwidth to enable the 40 G VSR and 43 G transport modes, which is more than required for 100 G mode where only 25 G bandwidth is needed and 43 G DQPSK mode where only 21.5 G bandwidth is needed. As such, an additional control can be added to reduce the output bandwidth (and power) of the final multiplexer 637 and driver amp 644 when the multi-mode serializer 600 is operating in 100 G or 43 G DQPSK modes. This may be accomplished, for example, by reducing the bias currents of the multiplexer 637 and driver amp 644.

In 43 G DQPSK mode, two 21.5 G data lanes are clocked into the final flip flops 629 and 630. The path selector 636 permits the 21.5 G data lane from the final flip flop 629 to pass directly through to the output driver 643. Similarly, the 21.5 G data lane from the final flip flop 630 passes directly through to the output driver 644. In this manner, two 21.5 G data lanes are provided to the transmitter optics from the output drivers 643 and 644.

In both 43 G transport and 43 G DQPSK modes, the path selector 634 selects a 21.5 GHz clock signal from the CMU 632 and provides it to the driver amp 641, which provides the 21.5 GHz clock to the transmitter optics.

The use of the half-rate architecture for the 40 G and 43 G modes allows the CMU 632 to be optimized for 100 G (i.e., 20 G or 25 G per channel) operation. As an alternative, the 40 G or 43 G architecture can be full-rate, which would require that the CMU be operated at twice the required rate for 100 G mode. This is easily accommodated by a simple divide by 2 circuit after the CMU to obtain the proper clock signal for timing the final output flip-flops in the multiplexers 622 and 624. In this case, the path including the final 2:1 multiplexer 637 would be slightly different. A full-rate 40 G or 43 G architecture may have performance advantages. Further, a full-rate CMU may potentially use less silicon area, since frequency-dependant components (like inductors in the CMU) may be smaller.

In summary, then, operation in 100 G mode is characterized by the following. Ten by 10 G data lanes are received by ten input nodes 610-619. All ten data lanes are recovered by the input nodes 610-619 and provided to two main multiplexing blocks 622 and 624. Each of the main multiplexing blocks 622 and 624 performs a 5:2 multiplexing function on 5×10 G data lanes to generate two 25 G data lanes, or 4×25 G data lanes total. The 4×25 G data lanes are clocked out of the main multiplexing blocks with four final flip flops 627-630 and then used directly by four output driver amps 641-644 which provide the 4×25 G data lanes to the transmitter optics.

Operation in 40 G VSR mode (and 43 G transport mode) is characterized by the following. Five by 10 G (or 10.75 G) data lanes are received by five input nodes 615-619. All five data lanes are recovered by the input nodes and provided to a dual-mode bypass block 620 which acts as an SFI5.2 receiver to decode the 5×10 G (or 10.75 G) data lanes into 4×10 G (or 10.75 G) data lanes. The 4×10 G (or 10.75 G) data lanes are provided to the main multiplexing block 622 which performs a 4:2 multiplexing function to generate two re-clocked 20 G (or 21.5 G) data lanes. The 2×20 G (or 21.5 G) data lanes are clocked out of the main multiplexing block with two final flip flops 629 and 630. Using a path selector 636, the two data lanes are 2:1 multiplexed by the final dynamic high speed multiplexer 637 to generate a 40 G (or 43 G) signal.

Operation in 43 G DQPSK mode is similar to operation in 40 G VSR and 43 G transport modes in some respects. Five by 10.75 G data lanes are received by the input nodes and provided to the SFI5.2 receiver block 620 which decodes the five data lanes into 4×10.75 G data lanes. The main multiplexing block generates 2×21.5 G data lanes which are clocked into the final flip flops 629 and 630. Rather than multiplexing the 2×21.5 G data lanes into a single 43 G signal, however, both data lanes are provided to the output driver amps 643 and 644 and provided to the transmitter optics.

Operation in 43 G transport and 43 G DQPSK modes is additionally characterized by the path selector 634 selecting a 21.5 GHz clock from the CMU 632 and providing it to the output driver amp 641.

The multi-mode serializer 600 can be implemented as a single IC. Alternately or additionally, it can be separated across two or more ICs as illustrated by serializers 202, 204 in FIG. 2 and implied by the two transmit paths (e.g., data lanes 610-614 and data lanes 615-619) of FIG. 6B. For instance, a first IC corresponding to the serializer 202 of FIG. 2 (and SFI5.2 receivers 302, 402, 502 and serializers 304, 404, 504 of FIGS. 3-5) may include input nodes 615-619, dual-mode bypass block 620, dual-mode multiplexer 622, retiming flip flops 629-631, static multiplexers 636 and 638, dynamic multiplexer 637, and output driver amps 643 and 644. In this case, the first IC additionally includes a CMU 632 and divider 633.

A second IC corresponding to the serializer 204 of FIG. 2 may include input nodes 610-614, optional bypass block 626, main multiplexing block 624, retiming flip flops 627, 628, static multiplexers 634, 635, output driver amps 641, 642, CMU 632, and divider 633. In this example, the main multiplexing block 624 can be a dual-mode multiplexing block or a single-mode multiplexing block.

In the embodiment just described, wherein the multi-mode serializer 600 is spread across two ICs, the first IC may be multi-mode while the second IC is single-mode. In particular, in 100 G mode the first IC can receive and convert half (e.g., 5) of the 10×10 G parallel data signals received from a host in a 100 G application to two serial 25 G signals. In this case, the aggregate data rate of the signals received by the first IC from the host is 50 G since it only receives half of the parallel data signals. In one or more other modes, the first IC can receive and convert all (e.g., 5) of the 5×10 G (or 5×10.75 G) parallel data signals in a 40 G VSR (or 43 G transport or 43 G DQPSK) application to one 40 G serial signal (or one 43 G signal plus 21.5 GHz clock, or two 21.5 G serial signals plus 21.5 GHz clock) as previously described. In this case, the aggregate data rate of the parallel signals received by the first IC is 40 G (or 43 G). Whereas the first IC is a multi-mode IC configured to process half of 10×10 G parallel signals for 100 G applications or all of 5×10 G (or 5×10.75 G) parallel signals for 40 G VSR, 43 G transport, and/or 43 G DQPSK applications, the second IC can be a single-mode IC configured to process the remaining half of the 10×10 G parallel signals for 100 G applications.

Figure 7:
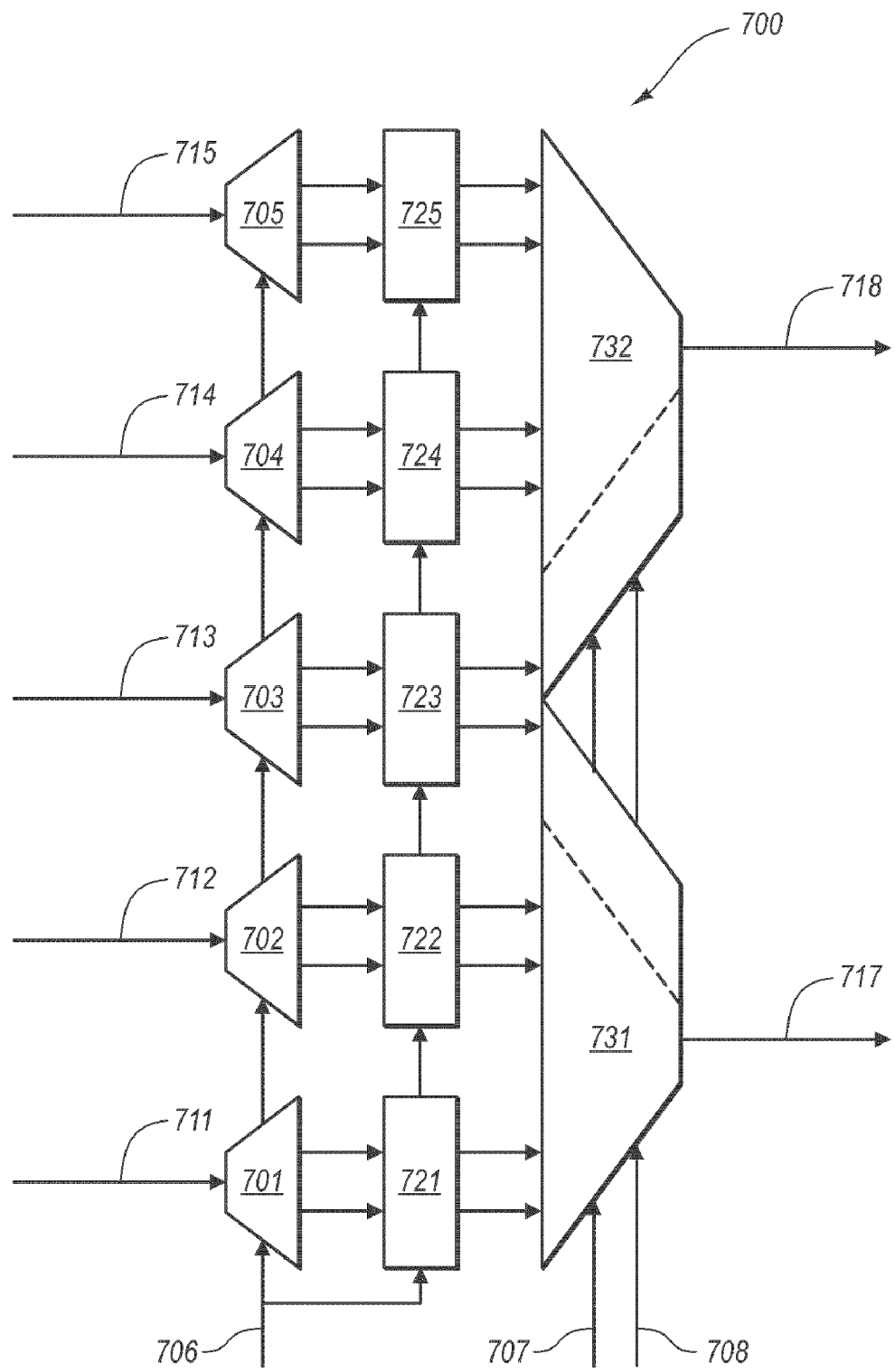
FIG. 7 illustrates an embodiment of a dual-mode multiplexer block which may be implemented in a multi-mode serializer.

With reference now to FIG. 7, one embodiment of a dual-mode main multiplexing block 700 is illustrated which may be used in embodiments of the multi-mode serializer 600 depicted in FIG. 6B. The dual-mode multiplexer 700 may correspond to the main multiplexing block 622 and/or 624 of FIG. 6B.

The dual-mode multiplexer 700 includes a plurality of 2:1 input demultiplexers 701-705 for receiving and doubling a plurality of input data lanes 711-715. Coupled to the plurality of 2:1 input demultiplexers are a plurality of synchronizer flip flops 721-725 for clocking the doubled data lanes out of the input demultiplexers 701-705. The input demultiplexers 701-705 and synchronizer flip flops 721-725 use a divided down clock 706 supplied by the divider 633 of FIG. 6B, which may be a 5 GHz clock for instance. Coupled to the plurality of synchronizer flip flops 721-725 are a plurality of output multiplexers 731 and 732. Each of the output multiplexers 731 and 732 generates a single data lane 733 and 734, respectively, from multiple input data lanes. A mode-selection signal 707 selects the 100 G or 40 G/43 G modes for the output multiplexers 731 and 732. A clock signal 708 provided by the CMU 632 is used to clock the data out of the output multiplexers 731 and 732. The clock signal 708 may be a 20 GHz, 21.5 GHz or 25 GHz signal depending on the mode of operation.

In 100 G mode, the dual-mode multiplexer 700 receives 5×10 G data lanes 711-715 from the input nodes 615-619 of FIG. 6B. The 5×10 G data lanes are converted to 10×5 G data lanes, synchronized and provided to two 5:1 output multiplexers 731 and 732 (5:1 output mode having been selected by the mode-selection signal 707). Using a 25 GHz clock signal 708, each output multiplexer 731 and 732 generates a 25 G data lane 717 and 718. A second dual-mode multiplexer may similarly receive 5×10 G data lanes from the input nodes 610-614 of FIG. 6B and generate 2×25 G data lanes.

In 40 G VSR (and 43 G transport or 43 G DQPSK) mode, the dual-mode multiplexer 700 receives 4×10 G (or 10.75 G) data lanes 711, 712, 714 and 715 from the SFI receiver block 620 of FIG. 6B. Note that the data lane 713 is unused. The 4×10 G (or 10.75 G) data lanes are converted to 8×5 G (or 5.375 G) data lanes, synchronized and provided to two 4:1 output multiplexers 731 and 732. Using a 20 GHz (or 21.5 GHz) clock signal 708, each output multiplexer 731 and 732 generates a 20 G (or 21.5 G) data lane 717 and 718.

IV. Example Multi-Mode Deserializer

Figure 8A:
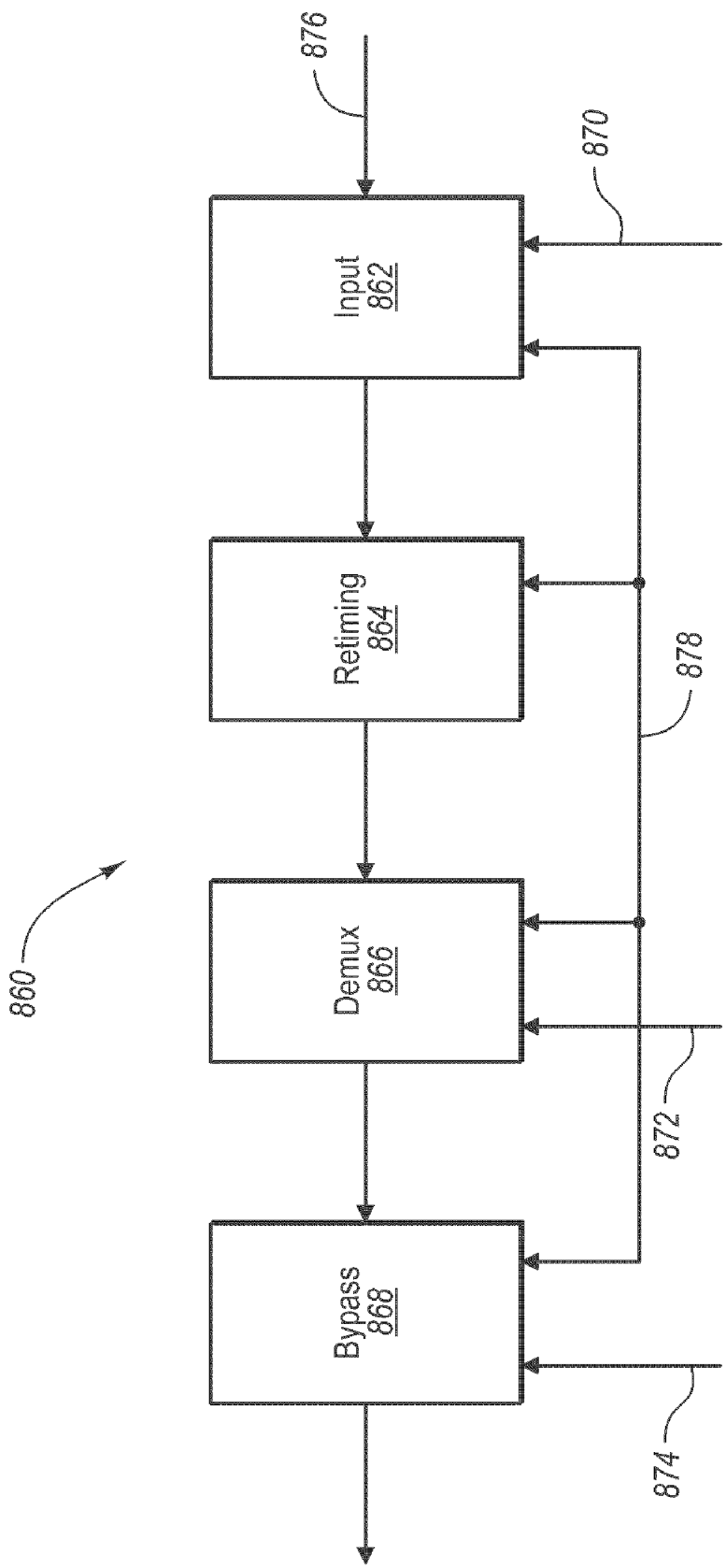
FIG. 8A illustrates a simplified block view of one embodiment of a multi-mode deserializer.
Figure 8B:
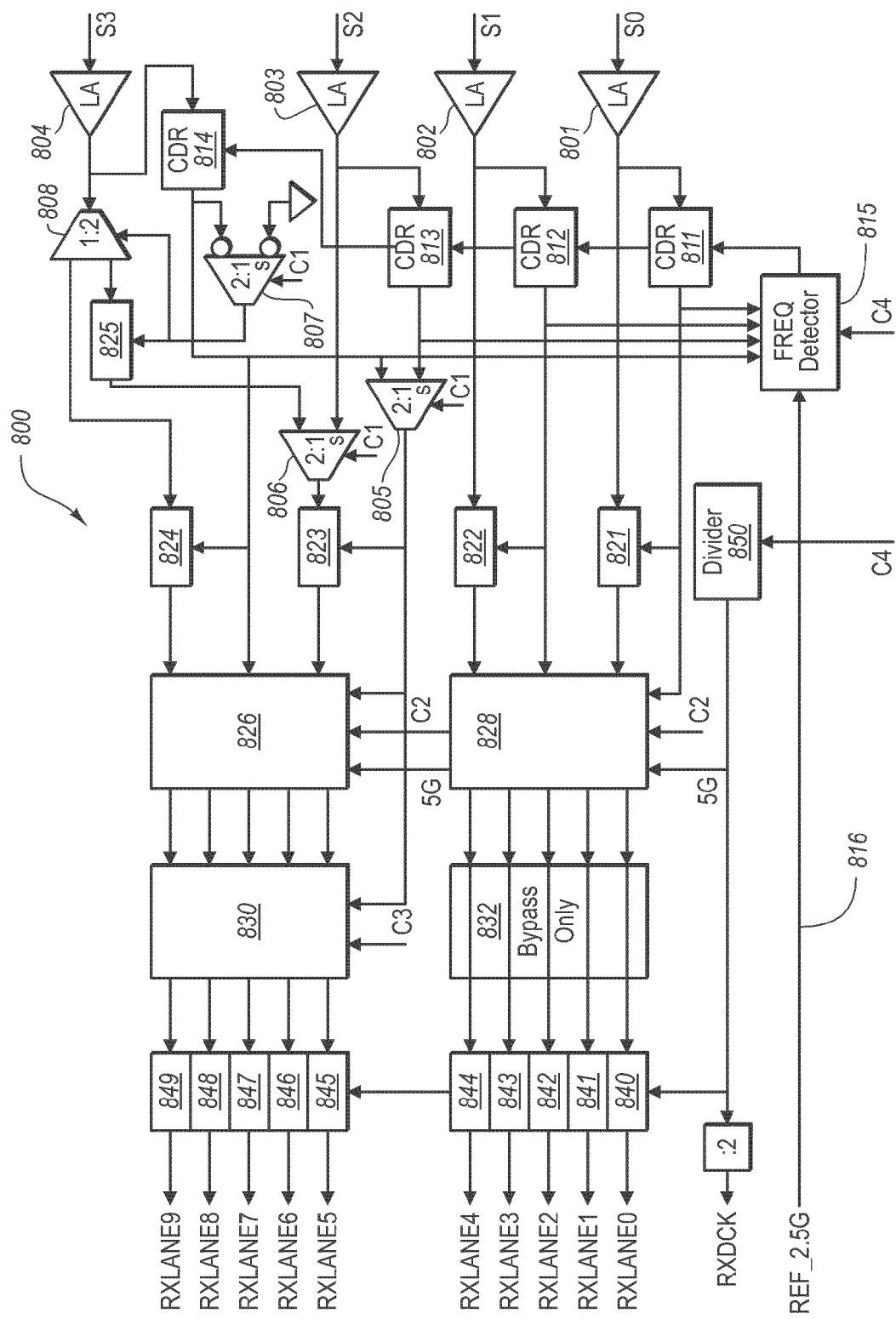
FIG. 8B illustrates one embodiment of the multi-mode deserializer of FIG. 8A.

Now with regard to FIGS. 8A and 8B, a multi-mode deserializer is described which may be implemented in two or more of the device architectures 200, 300, 400 and 500 of FIGS. 2-5. Specifically, the multi-mode deserializer may correspond to the deserializers 252 and 254 of FIG. 2, the SFI5.2 transmitter 318 and deserializer 316 of FIG. 3, the SFI5.2 transmitter 428 and deserializer 426 of FIG. 4 and the SFI5.2 transmitter 548 and deserializer 546 of FIG. 5. As will be described, the multi-mode deserializer may operate in at least two of 100 G mode (e.g., in a 100 GE application), 40 G VSR mode, 43 G transport mode and 43 G DQPSK mode.

In particular, FIG. 8A illustrates a simplified block view of one embodiment of a multi-mode deserializer 860. The multi-mode deserializer 860 is designed to accept one or more receive signals at different data rates so that it may be used in the architectures 200, 300, 400 and 500 already described as well as in other architectures. Accordingly, the multi-mode deserializer 860 includes an input stage 862 for accepting one or more receive signals, a retiming stage 864, a demultiplexing stage 866 and a bypass stage 868. Some of these components perform different functions depending, for instance, on the number of accepted receive signals, or the aggregate data rate of the received signals. For this reason, mode selection signals 870, 872 and 874 may be provided by a micro-controller, in one embodiment, to instruct each component what function to perform.

In the present example, the input stage 862 can accept one or more receive signals 876. The one or more receive signals 876 may be provided by receiver optics in an optoelectronic device. According to one embodiment, the input stage 862 accepts only one receive signal at a 40 G or 43 G transport data rate and separates the one receive signal into two 20 G or 21.5 G signals. In another embodiment, the input stage may accept four 25 G receive signals (100 G aggregate data rate) or two 21.5 G receive signals (43 G DQPSK aggregate data rate) and pass the four 25 G or two 21.5 G receive signals directly through to the retiming stage 864. To accomplish these different functions, the input stage 862 can include an input dynamic high-speed demultiplexer and a plurality of path selectors, such as static demultiplexers, as will be described more fully with respect to FIG. 8B. The input stage 862 may also include one or more clock and data recovery blocks for recovering a clock from the one or more receive signals. The recovered clock 878 and divided versions thereof may be provided to the components 864, 866 and 868 for processing the signals accepted/generated at the input stage 862.

Signals generated in the input stage 862 are provided to the retiming stage 864, which then provides retimed signals to the demultiplexer stage 866. The demultiplexer stage may separate the retimed signals into different numbers of separated signals depending on the aggregate data rate of the retimed signals received from the input stage and then provide the separated signals to the bypass block 868. The operation of the bypass block may similarly depend on the aggregate data rate of the retimed signals, passing the separated signals directly through as output or encoding the separated signals.

For instance, when the aggregate data rate is 40 G or 43 G, the demultiplexer stage 866 separates two retimed signals into four separated signals and provides them to the bypass block. The bypass block 868 encodes the data prior to providing encoded data as output. When the aggregate data rate is 100 G, however, the demultiplexer stage 866 separates four retimed signals into ten separated signals and the bypass block 868 passes the ten separated signals as output.

The multi-mode deserializer 860 of FIG. 8A can be implemented in a single IC. Alternately or additionally, it can be separated across multiple ICs. When combined in a single IC, it may correspond to an IC that includes both of deserializers 252 and 254 of FIG. 2. When separated across multiple ICs, it may correspond to two ICs, one that includes deserializer 252 and another that includes deserializer 254.

Turning now to FIG. 8B, a specific embodiment 800 of the example multi-mode deserializer is schematically illustrated. The multi-mode deserializer 800 includes a plurality of input nodes for receiving one or more high speed serial signals from a post-amplifier, for example. Each input node is designed to receive a single data lane. Each input node may include a limiting amplifier and a CDR. For instance, a plurality of limiting amplifiers 801-804 are provided for receiving one or more data lanes from receiver optics in an optoelectronic device. A plurality of CDRs 811-814 are coupled to the outputs of the limiting amplifiers 801-804 for recovering a clock on the one or more received data lanes. In 100 G mode, each of four input nodes, including a limiting amplifier 801-804 and a CDR 811-814, receives a 25 G signal and recovers a 25 GHz clock for each signal. In 40 G VSR and 43 G transport modes only one input node, including limiting amplifier 804 and CDR 814, receives a 40 G (or 43 G) signal and recovers a 20 GHz or 21.5 GHz clock signal. In 43 G DQPSK mode, two input nodes, including limiting amplifiers 803 and 804 and CDRs 813 and 814, each receive a 21.5 G data lane and recover a 21.5 GHz clock.

In the present embodiment, a single frequency detector 815 is shared by all of the CDRs 811-814 irrespective of the mode of operation, saving the cost of multiple frequency detector blocks for each received data lane. Hence, in 100 G or 43 G DQPSK modes, an input multiplexer in the frequency detector 815 can cycle through each of the four individual 25 GHz clocks in 100 G mode or each of the two individual 21.5 GHz clocks in 43 G DQPSK mode to sequentially perform a frequency detection function. The CDRs 811-814 can be set to a frequency acquisition mode individually or as a group when an out of frequency lock condition is detected.

In one embodiment of the invention, the frequency detector 815 may receive a 2.5 GHz reference clock 816 for performing its frequency detection function. In this case, the frequency detector 815 may perform a divide by 10 operation on the four individual 25 GHz clocks while in 100 G mode, or a divide by 8 operation on one or more individual 20 GHz or 21.5 GHz clocks while in 40 G VSR, 43 G transport or 43 G DQPSK modes.

In addition to being coupled to the plurality of CDRs 811-814, the outputs of the limiting amplifiers 801-804 are coupled to a plurality of initial retiming flip flops 821-824 for clocking one or more high speed serial data lanes into a plurality of main demultiplexing blocks 826 and 828. However, a number of other components may be disposed between the limiting amplifiers 801-804, the initial retiming flip flops 821-824 and the CDRs 811-14. For instance, three static multiplexers or path selectors 805-807, an input dynamic high speed demultiplexer 808 and a fifth initial retiming flip flop 825 are provided.

During operation in 40 G VSR and 43 G transport modes, the clock signal (20 GHz or 21.5 GHz) generated by the CDR 814 may be provided via the path selector 807 to the fifth initial retiming flip flop 825 and the input dynamic demultiplexer 808, to the initial retiming flip flop 824 and the main demultiplexing block 826, and via the path selector 805 to the main demultiplexing block 826 and a dual-mode bypass block 830. The 20 GHz or 21.5 GHz clock signal and a 40 G or 43 G data lane from limiting amplifier 804 are used by the dynamic demultiplexer 808 to generate two 20 G or 21.5 G data lanes, one of which is clocked into the initial flip flop 824, and the other of which is clocked into the initial flip flop 825. The path selector 806 provides the 20 G or 21.5 G data lane from flip flop 825 to flip flop 823. Both 20 G or 21.5 G data lanes are clocked into the main demultiplexing block 826.

During operation in 100 G and 43 G DQPSK modes, the clock signal (25 GHz or 21.5 GHz) generated by the CDR 814 may be provided to the initial retiming flip flop 824 and the main demultiplexing block 826 for clocking in data. The 25 G or 21.5 G input data lane from limiting amplifier 804 passes directly through the dynamic multiplexer 808 to the initial retiming flip flop 824 and then to the main demultiplexing block 826. Similarly, the 25 G or 21.5 G input data lane from the limiting amplifier 803 passes through the path selector 806 to the initial retiming flip flop 823 and then on to the main demultiplexing block 826. The 25 GHz or 21.5 GHz clock signal from the CDR 813 is provided through the path selector 805 to the main demultiplexing block 826 and the dual mode bypass block 830. In 43 G DQPSK mode, the limiting amplifiers 801 and 802, CDRs 811 and 812 and main demultiplexing block 828 are unused. In 100 G mode, however, the 25 G input data lanes received by limiting amplifiers 801 and 802 are clocked into the initial retiming flip flops 821 and 822 and the main demultiplexing block with 25 GHz clock signals from CDRs 811 and 812, respectively.

The input demultiplexer 808 and limiting amp 804 are designed to have up to 43 G bandwidth to enable 40 G VSR and 43 G transport modes, which is more than required for 100 G mode where only 25 G bandwidth is needed and 43 G DQPSK mode where only 21.5 G bandwidth is needed. Just as with the final multiplexer 637 and driver amp 644 of FIG. 6B, an additional control can be added to reduce the input bandwidth (and power) of the input demultiplexer 808 and limiting amp 804 when the multi-mode serializer 800 is operating in 100 G or 43 G DQPSK modes. For instance, this may be done by reducing the bias currents of the demultiplexer 808 and limiting amplifier 804.

The outputs of initial retiming flip flops 821-824 are coupled to the main demultiplexing blocks 826 and 828. The main demultiplexing block 826 is a dual-mode main demultiplexing block, the structure of which will be described more fully with respect to FIG. 9. In the present embodiment, the dual-mode demultiplexer 826 may perform a 2:5 or 2:4 demux function depending on its mode of operation. When operating in 100 G mode, the dual-mode main multiplexing block 826 performs a 2:5 demux on the two data lanes received from the initial retiming flip flops 823 and 824, generating 5×10 G data lanes from 2×25 G data lanes. However, when operating in 40 G or 43 G modes, the dual-mode demultiplexer 826 receives two 20 G or 21.5 G data lanes and performs a 2:4 demux function thereon to generate four re-clocked 10 G or 10.75 G data lanes.

The main demultiplexing block 828 may be a dual-mode demultiplexing block similar to the dual-mode demultiplexer 826. However, the demultiplexer block 828 may also be a single-mode 2:5 demultiplexing block for generating five re-clocked 10 G data lanes from the 2×25 G data lanes received from initial retiming flip flops 821 and 822. Using a dual-mode demultiplexer for main block 828 may enable certain test features which may be desirable for improving performance, although it is not required since the main block 828 only performs a 2:5 demux function during normal operation.

The output of the main demultiplexing block 826 is coupled to the dual-mode bypass block 830 and the output of the main demultiplexing block 828 is coupled to the optional bypass block 832. The bypass blocks 830 and 832 are coupled to a plurality of output nodes 840-849, each of which may include a final retiming flip flop. When operating in 100 G mode, the dual-mode bypass block 830 and bypass block 832 permit the 10×10 G data lanes from main demultiplexing blocks 826 and 828 to pass straight through to the output nodes 840-849, the 10×10 G data lanes then being provided to a host device for further processing.

In 40 G VSR, 43 G transport and/or 43 G DQPSK modes, only 4×10 G or 4×10.75 G data lanes are provided from the dual-mode demultiplexer 826, none being provided by the main demultiplexer block 828. This has a number of implications. First, if the data lanes provided at the output nodes 840-849 are to comply with the SFI5.2 protocol, the dual-mode bypass block 830 operates as an SFI5.2 transmitter. In this case, 4×10 G (or 10.75 G) data lanes are encoded by the dual-mode bypass block 830 into 5×10 G (or 10.75 G) data lanes which are provided to the host device. Second, the bypass block 832 is unnecessary since the main demultiplexing block 828 is only used during operation in 100 G mode. That is, the output of the main demultiplexing bock 832 could be coupled directly to the output nodes 840-844. Finally, the output nodes 840-844 only provide data lanes to a host during operation in 100 G mode.

Similar to the Serializer 600 of FIG. 6, the Deserializer 800 of FIG. 8 implements a full-rate architecture for 100 G mode and a half-rate architecture for 40 G and 43 G modes. One skilled in the art will recognize that the use of the half-rate architecture for the 40 G and 43 G modes allows the CDR 814 to be optimized for 100 G (i.e., 20 G or 25 G per channel) operation. As an alternative, the 40 G or 43 G architecture can be full-rate, which would require that the CDR be operated at twice the required rate for 100 G mode. This is easily accommodated by a simple divide by 2 circuit after the CDR to obtain the proper clock signal for timing the input flip-flops in the demultiplexers 826 and 828. Obviously, the path including the input 1:2 demultiplexer 808 would be slightly different. A full-rate 40 G or 43 G architecture may have performance advantages. Further, a full-rate CDR may potentially use less silicon area, since frequency-dependant components may be smaller.

In summary, then, operation in 100 G mode is characterized by the following. Four by 25 G serial data lanes are received by four input nodes, each input node including a limiting amplifier 801-804 and a dedicated CDR 811-814. A 25 GHz clock signal is recovered for each serial data lane and used to clock the four 25 G signals into two main demultiplexing blocks 826 and 828. Each of the main demultiplexing blocks 826 and 828 performs a 2:5 demultiplexing function on 2×25 G data lanes to generate five 10 G data lanes, or 10×10 G data lanes total. The 10×10 G data lanes are clocked out of the main demultiplexing blocks into 10 output nodes 840-849 and then provided for further processing.

Operation in 40 G VSR mode (and 43 G transport mode) is characterized by the following. One 40 G (or 43 G) serial data lane is received by an input node, the input node including a limiting amplifier 804 and a CDR 814. The CDR recovers a 20 GHz (or 21.5 GHz) clock signal from the serial data lane which is used by an initial retiming flip flop 808 and an input dynamic high speed demultiplexer 808 to generate two 20 G (or 21.5 G) data lanes from the 40 G (or 43 G) serial data lane. The two 20 G (or 21.5 G) data lanes are clocked into a dual-mode demultiplexing block 826 which performs a 2:4 demultiplexing function on 2×20 G (or 21.5 G) data lanes to generate four 10 G (or 10.75 G) data lanes. The 4×10 G (or 10.75 G) parallel data lanes are provided to a dual-mode bypass block 620 which acts as an SFI5.2 transmitter to encode the 4×10 G (or 10.75 G) data lanes into 5×10 G (or 10.75 G) data lanes. The 5×10 G (or 10.75 G) data lanes are clocked out of the multi-mode deserializer 800 using five output nodes 845-849 and subsequently provided to a host device.

Operation in 43 G DQPSK mode is characterized by the following. Two by 21.5 G serial data lanes are received by two input nodes, each input node including a limiting amplifier 803 and 804 and a dedicated CDR 813 and 814. A 21.5 GHz clock signal is recovered for each serial data lane and used to clock the two 21.5 G signals into the main demultiplexing block 826. In all other respects, operation in 43 G DQPSK mode is similar to operation in 40 G VSR and 43 G transport modes, with a main demultiplexing block generating 4×10.75 G data lanes from the two 21.5 G signals and encoding the 4×10.75 signals into 5×10.75 G signals which may be provided to a host.

The multi-mode deserializer 800 can be implemented as a single IC. Alternately or additionally, it can be separated across two or more ICs as illustrated by deserializers 252, 254 in FIG. 2 and implied by the two receive paths (e.g., data lanes 840-844 and data lanes 845-849) of FIG. 8B. For instance, a first IC corresponding to deserializer 252 of FIG. 2 (and deserializers 316, 426, 546 and SFI 5.2 transmitters 318, 428, 548 of FIGS. 3-5) may include input nodes 803, 804, CDRs 813, 814, path selectors 805-807, dynamic demultiplexer 808, retiming flip flops 823-825, dual-mode demultiplexer 826, dual-mode bypass block 830, and output nodes 845-849. The first IC additionally includes its own frequency detector 815 and divider 850.

A second IC corresponding to the deserializer 254 of FIG. 2 may include input nodes 801, 802, CDRs 811, 812, retiming flip flops 821, 822, main demultiplexing block 828, optional bypass block 832, output nodes 840-844, frequency detector 815, and divider 850.

In the embodiment just described, wherein the multi-mode deserializer 800 is spread across two ICs, the first IC may be multi-mode while the second IC is single-mode. In particular, in 100 G mode the second IC can receive and convert half (e.g., 2) of the 4×25 G serial data signals from an optical network in a 100 G application to five parallel 10 G data signals for a host. In this case, the aggregate data rate of the signals received by the first IC from the optical network is 50 G since it only receives half of the serial signals. In one or more other modes, the first IC can receive and convert all of the serial data signals (e.g., 1×40 G, 1×43 G, or 2×21.5 G) from an optical network in a 40 G VSR, 43 G transport, or 43 G DQPSK application to five parallel 10 G (or 10.75 G) data signals for the host, as previously described. In this case, the aggregate data rate of the one or more serial signals received by the first IC from the optical network is 40 G (or 43 G). Whereas the first IC is a multi-mode IC configured to process half of 4×25 G serial signals for 100 G applications or all of the received serial signals for 40 G VSR, 43 G transport, and/or 43 G DQPSK applications, the second IC can be a single-mode IC configured to process the remaining half of the 4×25 G serial signals for 100 G applications.

Figure 9:
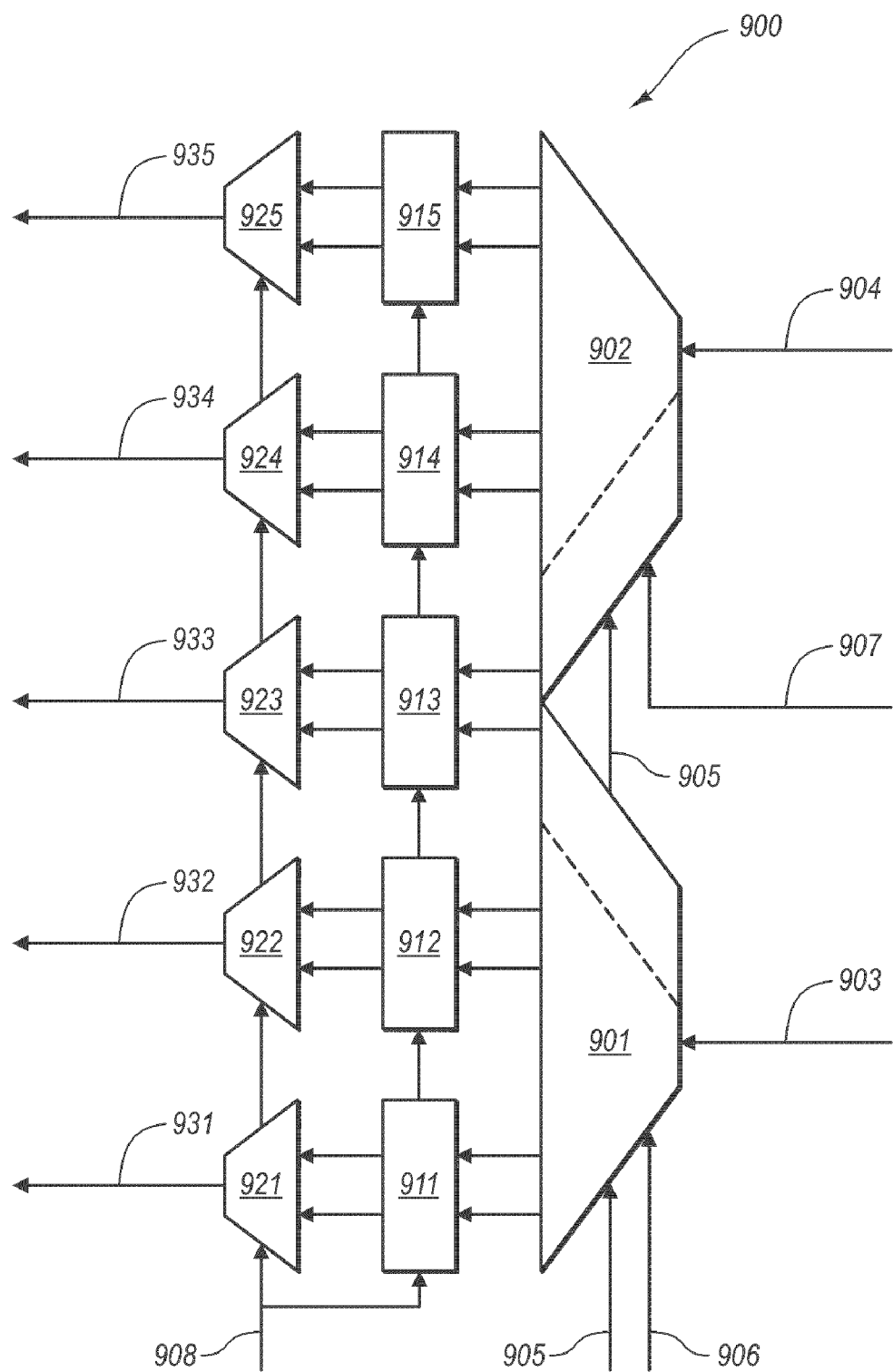
FIG. 9 illustrates an embodiment of a dual-mode demultiplexer block which may be implemented in a multi-mode deserializer.

With reference now to FIG. 9, one embodiment of a dual-mode main demultiplexing block 900 is illustrated which may be used in embodiments of the multi-mode deserializer 800 depicted in FIG. 8B. The dual-mode demultiplexer 900 may correspond to the main demultiplexing blocks 826 and/or 828 of FIG. 8B.

The dual-mode demultiplexer 900 includes a plurality of input demultiplexers 901 and 902 for receiving a plurality of input data lanes 903 and 904. Each input demultiplexer 901 and 902 can receive a single data lane and generate multiple demultiplexed lanes, the number depending on the mode of operation (100 G, 40 G or 43 G). A mode-selection signal 905 selects the 100 G or 40 G/43 G modes for the input demultiplexers 901 and 902. Two recovered clock signals 906 and 907 are provided by the CDRs 813 and 814 of FIG. 8B to the input demultiplexers 901 and 902, respectively.

Coupled to the input demultiplexers are a plurality of synchronizer flip flops 911-915 for clocking the demultiplexed data lanes out of the input demultiplexers 901 and 902 and synchronizing the demultiplexed data lanes. The synchronizer flip flops 911-915 are coupled to a plurality of output multiplexers 921-925. The synchronizer flip flops 911-915 and the output multiplexers 921-925 use a divided down clock 908 supplied by a divider 850 of FIG. 8B, which may be a 5 GHz clock for example. Each output multiplexer performs a 2:1 mux function on two data lanes and generates a single data lane.

In 100 G mode, the dual-mode demultiplexer 900 receives 2×25 G data lanes from the initial retiming flip flops 823 and 824 of FIG. 8B. The 2×25 G data lanes are converted to 10×5 G data lanes (1:5 output mode having been selected by the mode-selection signal 905 for each of the input demultiplexers 901 and 902), synchronized and provided to five 2:1 output multiplexers 921-925. Using a 5 GHz clock signal 908, each output multiplexer 921-925 generates a 10 G data lane 931-935 from two 5 G input lanes. A second dual-mode demultiplexer corresponding to the main demultiplexing block 828 of FIG. 8B may similarly receive 2×25 G data lanes from the initial retiming flip flops 821 and 822 and generate 5×10 G data lanes.

In 40 G VSR (and 43 G transport or 43 G DQPSK) mode, the dual mode demultiplexer 900 receives 2×20 G (or 21.5 G) data lanes 903 and 904 with the two input demultiplexers 901 and 902. The mode-selection signal 905 configures the input demultiplexers 901 and 902 to perform a 1:4 demux function on the incoming data lanes 903 and 904 by simply not using one of each of their outputs. Thus, the 2×20 G (or 21.5 G) data lanes are converted to 8×5 G (or 5.375 G) data lanes, synchronized and provided to four output multiplexers 921, 922, 924 and 925. Each of the four output multiplexers 921, 922, 924 and 925 generates a 10 G (or 10.75 G) data lane 931, 932, 934 and 935. Note that the data lane 933 is unused in 40 G/43 G modes.

IV. Other Multi-Mode Serializer and Deserializer Configurations and Uses

Embodiments of multi-mode serializers and deserializers have been described with respect to FIGS. 6 through 9. Each multi-mode serializer or deserializer can be implemented individually on a single IC or on multiple ICs. Further, a multi-mode serializer and deserializer can be implemented together on the same IC or on multiple ICs, at least one of which is shared. Integrated circuits including at least some of the elements of a multi-mode serializer and/or deserializer may be referred to as SerDes ICs.

Advantageously, embodiments of the described multi-mode SerDes may be used in at least two different applications. In this manner, engineering resources and non-recurring engineering costs are significantly reduced. In particular, instead of developing multiple IC chip sets for different applications, only one chip set has to be developed. Additionally, because one chip set addresses the requirements of multiple markets, the resulting higher overall volumes reduce the cost of the ICs and bring in a greater return on research and development investment.

In 100 G mode, one or more multi-mode SerDes ICs can map 10×10 G parallel data lanes to 4×25 G serial data lanes and vice versa. In 40 G VSR, 43 G transport and 43 G DQPSK modes, one or more SerDes ICs can map 5×10 G (or 10.75 G) parallel data lanes to 1×40 G (or 43 G) or 2×21.5 G serial data lanes with an optional 21.5 GHz clock, and vice versa. Those skilled in the art will recognize that other multi-mode SerDes ICs may be implemented with different 100 G mappings by applying the principles of the present invention, and in particular by making a few changes to the main multiplexing and demultiplexing blocks.

For instance, if the 40 G and 43 G mode mappings remain the same, a 100 G mapping from 12×8.33 G data lanes to 4×25 G data lanes can be implemented using a multi-mode serializer with four dual-mode multiplexing blocks that can operate in 3:1 mode for 100 G applications and 2:1 mode for 40 G/43 G applications. This is in contrast to the multi-mode serializer 600 with two dual-mode multiplexing blocks that can operate in 5:2 or 4:2 modes. In the receive direction, 4×25 G data lanes can be mapped to 12×8.33 G data lanes using a multi-mode deserializer with four dual-mode demultiplexing blocks that can operate in 1:3 mode for 100 G applications and 1:2 mode for 40 G/43 G applications.

Alternately, a 100 G mapping from 8×12.5 G data lanes to 4×25 G data lanes can be implemented using a multi-mode serializer with four main multiplexing blocks that operate in 2:1 mode for 100 G, 40 G, and/or 43 G applications. In the receive direction, 4×25 G data lanes can be mapped to 8×12.5 G data lanes using a multi-mode deserializer with four main demultiplexing blocks that can operate in 1:2 mode for 100 G, 40 G and/or 43 G applications.

In yet another embodiment, a 100 G mapping from 10×10 G data lanes to 5×20 G data lanes can be implemented using a multi-mode serializer with five main multiplexing blocks that operate in 2:1 mode for 100 G, 40 G and/or 43 G applications. The receive direction can be implemented using a multi-mode deserializer with five main demultiplexing blocks that can operate in 1:2 mode for 100 G, 40 G and/or 43 G applications. In this embodiment, the CMU of the multi-mode serializer would not require a by 10 multiplier since the by 8 multiplier would be common between 100 G, 40 G and 43 G applications. Similarly, the CDRs of the multi-mode deserializer would not require a by 10 divider since the by 8 divider would be common between 100 G, 40 G and 43 G applications.

The architectures of the described multi-mode SerDes ICs are flexible so that other uses not described herein can take advantage of the architectures. For example, there are several test modes which can make verifying a SerDes IC and the optoelectronic device in which it is used easier. One test mode for 100 G applications is to bypass the SFI5.2 receiver 620 and SFI5.2 transmitter 830 of FIGS. 6 and 8, respectively, but use the main multiplexing blocks 622, 624 and main demultiplexing blocks 826, 828 in 4:2 mode and 2:4 mode, respectively. Normally when the SFI5.2 blocks 620 and 830 are bypassed, the main multiplexing blocks 622 and 624 are operated in 5:2 mode and the main demultiplexing blocks 826 and 828 are operated in 2:5 mode. In this test mode, only eight out of 10×10 G inputs and eight out of 10×10 G outputs are used. Each pair of inputs or outputs are then multiplexed to one of the high speed outputs and inputs, and then carried on one optical wavelength and so permit better isolation of how data is affected in the various signal paths.

Another possible SFI5.2 bypass mode (e.g., where the dual-mode bypass blocks 620 and 830 are operating in bypass mode rather than SFI5.2 receive or transmit modes), in combination with the main multiplexing block 622 in 4:2 mode, may include running the final dynamic high speed multiplexer 637 in 40 G mode, so that four 10 G inputs (out of five actually received by the main multiplexing block 622 during 100 G operation) are directly mapped into the 40 G output of the high speed multiplexer 637. Similarly, the input dynamic high speed demultiplexer 808 can be run in 40 G mode with the main demultiplexing block 826 in 2:4 mode so that a 40 G input is directly mapped into a 4×10 G output of four of the output nodes 845-849.

A test mode with even more signal path isolation would only use four out of the 10×10 G inputs and four out of the 10×10 G outputs. The main multiplexing and demultiplexing blocks would be placed in a static mode, simply selecting the desired input. In this way, a single input would be mapped to each high speed output in the multi-mode serializer and each high speed input would be mapped to a single 10 G output in the multi-mode deserializer. This way, any of the inputs could be mapped to one of the high speed outputs.

Another additional useful test mode can use the unused high speed outputs in the 40 G VSR, 43 G transport and 43 G DQPSK modes to output a 10 GHz or 10.75 GHz clock. For the 43 G transport and 43 G DQPSK modes, this would be in addition to the 21.5 GHz clock.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A SerDes configured to support multiple data rates, the SerDes comprising:
   a serializer portion including:
      a first bypass stage configured to receive a plurality of transmit signals, wherein the first bypass stage passes the transmit signals unchanged to a multiplexer stage when the transmit signals are at a first aggregate data rate and decodes the transmit signals when the transmit signals are at a second aggregate data rate;
      the multiplexer stage coupled with an output of the bypass stage and configured to receive the unchanged transmit signals or the decoded transmit signals and generate a plurality of multiplexed signals; and
      a dynamic multiplexer configured to: combine two of the multiplexed signals into a single output signal; or pass one of the multiplexed signals through unchanged as one of two or more output signals depending on the aggregate data rate of the transmit signals; and
   a deserializer portion including:
      a demultiplexer stage configured to receive and demultiplex a plurality of retimed signals, the number of retimed signals and the number of demultiplexed signals depending on the aggregate data rate of one or more receive signals received by the deserializer portion, the one or more receive signals being at the first aggregate data rate or the second aggregate data rate; and a second bypass stage coupled with the demultiplexer and configured to: pass the demultiplexed signals through unchanged when the one or more receive signals are at the first aggregate data rate or encode the demultiplexed signals when the one or more receive signals are at the second aggregate data rate.

2. The serializer/deserializer of claim 1, wherein the first aggregate data rate is substantially equal to 100 gigabits per second and the second aggregate data rate is substantially equal to one or more of:
- 40 gigabits per second very short range;
- 43 gigabits per second transport; and
- 43 gigabits per second DQPSK.

3. The serializer/deserializer of claim 2, wherein:
the dynamic multiplexer combines two multiplexed signals to obtain a single serial signal when the aggregate data rate of the transmit signals is 40 gigabits per second very short range or 43 gigabits per second transport; and
the dynamic multiplexer passes through one of the multiplexed signals when the aggregate data rate of the transmit signals is 100 gigabits per second or 43 gigabits per second DQPSK.

4. The serializer/deserializer of claim 2, wherein:
the demultiplexer stage receives two retimed signals and generates four demultiplexed signals when the aggregate data rate of the one or more receive signals is substantially equal to 40 gigabits per second very short range, 43 gigabits per second transport or 43 gigabits per second DQPSK, and
the demultiplexer stage receives four retimed signals and generates ten demultiplexed signals when the aggregate data rate of the one or more receive signals is substantially equal to 100 gigabits per second.

5. The serializer/deserializer of claim 2, wherein the deserializer portion implements one or more of the following mappings from one or more receive signals to demultiplexed signals at the first aggregate data rate and the serializer portion implements an inverse mapping from transmit signals to one or more output signals:
four receive signals having data rates substantially equal to 25 gigabits per second to ten demultiplexed signals having data rates substantially equal to 10 gigabit per second;
four receive signals having data rates substantially equal to 25 gigabits per second to twelve demultiplexed signals having data rates substantially equal to 8.33 gigabits per second;
four receive signals having data rates substantially equal to 25 gigabits per second to eight demultiplexed signals having data rate rates substantially equal to 12.5 gigabits per second; or
five receive signals having data rates substantially equal to 20 gigabits per second to ten demultiplexed signals having data rates substantially equal to 10 gigabits per second.

6. The serializer/deserializer of claim 2, wherein one or more of:
the deserializer portion is configured to map one receive signal having a data rate substantially equal to 40 gigabits per second to five encoded signals each having a data rate substantially equal to 10 gigabits per second and the serializer portion is configured to map five transmit signals each having a data rate substantially equal to 10 gigabits per second to one output signal having a data rate substantially equal to 40 gigabits per second;
the deserializer portion is configured to map one receive signal having a data rate substantially equal to 43 gigabits per second to five encoded signals each having a data rate substantially equal to 10.75 gigabits per second and the serializer portion is configured to map five transmit signals each having a data rate substantially equal to 10.75 gigabits per second to one output signal having a data rate substantially equal to 40 gigabits per second and a 21.5 gigahertz clock signal; or
the deserializer portion is configured to map two receive signals each having a data rate substantially equal to 21.5 gigabits per second to five encoded signals each having a data rate substantially equal to 10.75 gigabits per second and the serializer portion is configured to map five transmit signals each having a data rate substantially equal to 10.75 gigabits per second to two output signals each having a data rate substantially equal to 21.5 gigabits per second and a 21.5 gigahertz clock signal.

7. A multi-mode serializer comprising:
a plurality of input nodes for receiving half of a plurality of first parallel data signals, the first parallel data signals being at a first aggregate data rate substantially equal to 100 gigabits per second;
a dual-mode bypass block coupled to outputs of the input nodes, the dual-mode bypass block passing the half of the first parallel data signals through unchanged when the first parallel data signals are at the first aggregate data rate;
a main multiplexing block coupled to outputs of the input nodes, the main multiplexing block being configured to receive the unchanged parallel data signals and output two first serial signals when the first parallel data signals are at the first aggregate data rate;
a plurality of final retiming flip flops coupled to outputs of the main multiplexing block, the final retiming flip flops being configured to receive the serial signals and output two first retimed serial signals; and
a dynamic multiplexer coupled to an output of one of the final retiming flip flops, the dynamic multiplexer being configured to receive and pass through one of the first retimed serial signals when the first parallel data signals are at the first aggregate data rate.

8. The multi-mode serializer of claim 7, further comprising a single clock multiplier unit whose clock signal is provided to the main multiplexing block and the final retiming flip flops.

9. The multi-mode serializer of claim 8, further comprising a programmable divider coupled to the clock multiplier unit for providing divided versions of the clock signal generated by the clock multiplier unit to the main multiplexing block and to the input nodes.

10. The multi-mode serializer of claim 7, wherein each of the input nodes includes one or more of a delay lock loop and a clock and data recovery block.

11. The multi-mode serializer of claim 7, wherein:
the input nodes are further configured to receive all of a plurality of second parallel data signals, the second parallel data signals being at a second aggregate data rate;
the dual-mode bypass block is further configured to decode the second parallel data signals when the second parallel data signals are at the second aggregate data rate;
the main multiplexing block is further configured to receive the decoded parallel data signals and output two second serial signals when the second parallel data signals are at the second aggregate data rate, the data rate of each of the second serial signals being different than the data rate of each of the first serial signals;

the plurality of final retiming flip flops are further configured to receive the second serial signals and output two second retimed serial signals; and the dynamic multiplexer is further coupled to outputs of two of the final retiming flip flops and is further configured to combine the two second retimed serial signals into one output signal or pass through one of the second retimed signals unchanged depending on the second aggregate data rate.

12. The multi-mode serializer of claim 11, wherein the main multiplexing block is a dual-mode main multiplexing block and includes:

a plurality of input demultiplexers for receiving and demultiplexing the unchanged parallel data signals or the decoded parallel data signals into a plurality of demultiplexed signals;

a plurality of synchronizing flip flops coupled to outputs of the input demultiplexers and configured to synchronize the demultiplexed signals, the quantity of synchronizing flip flops being the same as the quantity of input demultiplexers; and a plurality of output multiplexers coupled to outputs of the synchronizing flip flops and configured to receive the demultiplexed signals, wherein there are fewer output multiplexers than synchronizing flip flops and wherein the output multiplexers perform a first multiplexing operation on the demultiplexed signals when generated from the unchanged parallel data signals and a second multiplexing operation on the demultiplexed signals when generated from the decoded parallel data signals to generate the two first or second serial signals.

13. The multi-mode serializer of claim 12, wherein one or more of:

the plurality of input nodes receive five first parallel data signals each having a data rate substantially equal to 10 gigabits per second, the five parallel data signals are unchanged by the dual-mode bypass block and are received by five 2:1 input demultiplexers which generate ten 5 gigabits per second demultiplexed signals, five synchronizing flip flops synchronize the ten demultiplexed signals, and two output multiplexers operating in a 5:1 mode receive the ten demultiplexed signals and generate two first serial signals each having a data rate substantially equal to 25 gigabits per second;

the second aggregate data rate is substantially equal to 40 gigabits per second very short range, the plurality of input nodes receive five second parallel data signals each having a data rate substantially equal to 10 gigabits per second, the five second parallel data signals are decoded into four decoded parallel data signals each having a data rate substantially equal to 10 gigabits per second by the dual-mode bypass block, the four decoded parallel data signals are received by four 2:1 input demultiplexers which generate eight demultiplexed signals each having a data rate substantially equal to 5 gigabits per second, four synchronizing flip flops synchronize the eight demultiplexed signals, and two output multiplexers operating in a 4:1 mode receive the eight demultiplexed signals and generate two second serial signals each having a data rate substantially equal to 20 gigabits per second; or the second aggregate data rate is substantially equal to 43 gigabits per second, the plurality of input nodes receive five second parallel data signals each having a data rate substantially equal to 10.75 gigabits per second, the five second parallel data signals are decoded into four decoded parallel data signals each having a data rate substantially equal to 10.75 gigabits per second by the dual-mode bypass block, the four decoded parallel data signals are received by four 2:1 input demultiplexers which generate eight demultiplexed signals each having a data rate substantially equal to 5.375 gigabits per second, four synchronizing flip flops synchronize the eight demultiplexed signals, and two output multiplexers operating in the 4:1 mode receive the eight demultiplexed signals and generate two second serial signals each having a data rate substantially equal to 21.5 gigabits per second.

14. The multi-mode serializer of claim 11, further comprising:

a plurality of path selectors coupled to outputs of the final retiming flip flops; and a plurality of output driver amplifiers coupled to the outputs of the path selectors and the dynamic multiplexer;

wherein the plurality of path selectors direct the retimed signals to the output driver amplifiers and the dynamic multiplexer depending on the first aggregate data rate or the second aggregate data rate.

15. The multi-mode serializer of claim 11, wherein:

the second aggregate data is substantially equal to 40 gigabits per second very short range or 43 gigabits per second transport and the dynamic multiplexer combines the second retimed serial signals into one output signal having a data rate substantially equal to 40 gigabits per second or 43 gigabits per second; or the second aggregate data is substantially equal to 43 gigabits per second DQPSK and the dynamic multiplexer passes through one of the two second retimed serial signals unchanged, each of the two second retimed serial signals having a data rate substantially equal to 21.5 gigabits per second.

16. The multi-mode serializer of claim 7, further comprising:

a first integrated circuit that includes the plurality of input nodes, dual-mode bypass block, main multiplexing block, plurality of final retiming flip flops, and dynamic multiplexer, the first integrated circuit being configured to serialize five of ten first parallel data signals each having a data rate substantially equal to 10 gigabits per second into two first retimed serial signals each having a data rate substantially equal to 25 gigabits per second; and a second integrated circuit configured to serialize the other five of the ten first parallel data signals into two additional retimed serial signals each having a data rate substantially equal to 25 gigabits per second.

17. The multi-mode serializer of claim 16, wherein the second integrated circuit includes:

five input nodes for receiving the other five of the ten first parallel data signals;

a second main multiplexing block coupled to outputs of the five input nodes, the second main multiplexing block being configured to receive the other five of the ten first parallel data signals and output two additional serial signals each having a data rate substantially equal to 25 gigabits per second; and two final retiming flip flops coupled to outputs of the second main multiplexing block, the two final retiming flip flops being configured to receive the two additional serial signals and output the two additional retimed serial signals.

18. A multi-mode deserializer comprising:
a plurality of input nodes for receiving half of a plurality of first serial signals, the first serial signals being at a first aggregate data rate substantially equal to 100 gigabits per second;
a dynamic demultiplexer coupled to an output of one of the input nodes and configured to receive one of the first serial signals and pass it through unchanged to a first initial retiming flip flop when the first serial signals are at the first aggregate data rate;
a plurality of initial retiming flip flops that includes the first initial retiming flip flop, the initial retiming flip flops being coupled to outputs of the plurality of input nodes and the dynamic demultiplexer and configured to receive the first serial signals and output first retimed signals;
a main demultiplexing block coupled to outputs of the initial retiming flip flops, the main demultiplexing block being configured to receive the first retimed signals and output a plurality of first parallel data signals when the first serial signals are at the first aggregate data rate; and
a dual-mode bypass block coupled to an output of the main demultiplexing block, the dual-mode bypass block configured to pass through the five parallel data signals unchanged when the first serial signals are at the first aggregate data rate.

19. The multi-mode deserializer of claim 18, wherein each of the input nodes includes a clock and data recovery block for recovering a clock signal from each of the first serial signals.

20. The multi-mode deserializer of claim 19, further comprising a single frequency detector coupled to the clock and data recovery blocks, wherein the clock and data recovery blocks share the frequency detection function performed by the frequency detector.

21. The multi-mode deserializer of claim 18, wherein:
the input nodes are further configured to receive one or more second serial signals, the one or more second serial signals being at a second aggregate data rate;
the dynamic demultiplexer is further configured to do one or more of:
receive one of the one or more second serial signals and pass it through to the first initial retiming flip flop unchanged if the one or more second serial signals consists of two serial signals; and
receive one of the one or more second serial signals and separate it into two separated signals for the first initial retiming flip flop and a second initial retiming flip flop if the one or more second serial signals consists of one serial signal;
the initial retiming flip flops further include the second initial retiming flip flop and are further configured to receive the two serial signals or the two separated signals and output second retimed signals;
the main demultiplexing block is further configured to receive the second retimed signals and output a plurality of second parallel data signals when the one or more second serial signals are at the second aggregate data rate; and
the dual-mode bypass block is further configured to encode the second parallel data signals into a plurality of third parallel data signals, wherein the quantity of the third parallel data signals is greater than the quantity of the second parallel data signals.

22. The multi-mode deserializer of claim 21, wherein the main demultiplexing block is a dual-mode main demultiplexing block and includes:
a plurality of input demultiplexers for receiving the first retimed signals or the second retimed signals from the initial retiming flip flops and demultiplexing them into a plurality of demultiplexed signals, wherein the input demultiplexers perform a first demultiplexing operation on the first retimed signals and a second demultiplexing operation on the second retimed signals;
a plurality of synchronizing flip flops coupled to outputs of the input demultiplexers and configured to receive and synchronize the demultiplexed signals, the quantity of synchronizing flip flops being greater than the quantity of input demultiplexers; and
a plurality of output multiplexers coupled to outputs of the synchronizing flip flops for receiving and multiplexing the synchronized demultiplexed signals to generate the first parallel data signals or the second parallel data signals, wherein the quantity of output multiplexers is the same as the quantity of synchronizing flip flops, and wherein the quantity of the first or second parallel data signals is greater than the quantity of the first or second retimed signals.

23. The multi-mode deserializer of claim 22, wherein one or more of:
the plurality of input nodes receive two first serial signals each having a data rate substantially equal to 25 gigabits per second, the two first serial signals are retimed and received by two input demultiplexers operating in a 1:5 mode, the input demultiplexers generate ten demultiplexed signals each having a data rate substantially equal to 5 gigabits per second, five synchronizing flip flops receive and synchronize the ten demultiplexed signals, and five output multiplexers receive the ten synchronized demultiplexed signals and generate five first parallel data signals each having a data rate substantially equal to 10 gigabits per second;
the second aggregate data rate is substantially equal to 40 gigabits per second very short range, one of the input nodes receives one second serial signal having a data rate substantially equal to 40 gigabits per second, the serial signal is separated into two separated signals each having a data rate substantially equal to 20 gigabits per second, the two separated signals are retimed and received by two input demultiplexers operating in a 1:4 mode, the input demultiplexers generate eight demultiplexed signals each having a data rate substantially equal to 5 gigabits per second, four synchronizing flip flops receive and synchronize the eight demultiplexed signals, and four output multiplexers receive the eight synchronized demultiplexed signals and generate four second parallel data signals each having a data rate substantially equal to 10 gigabits per second;
the second aggregate data rate is substantially equal to 43 gigabits per second transport, one of the input nodes receives one second serial signal having a data rate substantially equal to 43 gigabits per second, the serial signal is separated into two separated signals each having a data rate substantially equal to 21.5 gigabits per second, the two separated signals are retimed and received by two input demultiplexers operating in a 1:4 mode, the input demultiplexers generate eight demultiplexed signals each having a data rate substantially equal to 5.375 gigabits per second, four synchronizing flip flops receive and synchronize the eight demultiplexed signals, and four output multiplexers receive the eight synchronized demultiplexed signals and generate four second parallel data signals each having a data rate substantially equal to 10.75 gigabits per second; and
the second aggregate data rate is substantially equal to 43 gigabits per second DQPSK, two of the input nodes receive two second serial signals, each having a data rate substantially equal to 40 gigabits per second, the two serial signals are retimed and received by two input demultiplexers operating in a 1:4 mode, the input demultiplexers generate eight demultiplexed signals each having a data rate substantially equal to 5.375 gigabits per second, four synchronizing flip flops receive and synchronize the eight demultiplexed signals, and four output multiplexers receive the eight synchronized demultiplexed signals and generate four second parallel data signals each having a data rate substantially equal to 10.75 gigabits per second.

24. The multi-mode deserializer of claim 23, wherein:
the second aggregate data rate is substantially equal to 40 gigabits per second very short range, and the dual-mode bypass block encodes the four second parallel data signals into five third parallel data signals each having a data rate substantially equal to 10 gigabits per second; or
the second aggregate data rate is substantially equal to 43 gigabits per second transport or 43 gigabits per second DQPSK and the dual-mode bypass block encodes the four second parallel data signals into five third parallel data signals each having a data rate substantially equal to 10.75 gigabits per second.

25. The multi-mode deserializer of claim 21, further comprising:
a plurality of path selectors coupled to inputs of the initial retiming flip flops; and
a plurality of limiting amplifiers coupled to inputs of the path selectors and the dynamic demultiplexer;
wherein the plurality of path selectors direct the half of the first serial signals or the one or more second serial signals from the limiting amplifiers to the retiming flip flops depending on the first aggregate data rate or the second aggregate data rate.

26. The multi-mode deserializer of claim 18, further comprising:
a first integrated circuit that includes the plurality of input nodes, dynamic demultiplexer, plurality of initial retiming flip flops, main demultiplexing block, and dual-mode bypass block, the first integrated circuit being configured to deserialize two of four first serial signals each having a data rate substantially equal to 25 gigabits per second into five first parallel data signals each having a data rate substantially equal to 10 gigabits per second; and
a second integrated circuit configured to deserialize the other two of the four first serial signals into five additional parallel data signals, each having a data rate substantially equal to 10 gigabits per second.

27. The multi-mode deserializer of claim 26, wherein the second integrated circuit includes:
two input nodes for receiving the other two of the four first serial signals;
two initial retiming flip flops coupled to outputs of the two input nodes and configured to receive the other two of the four first serial signals and output two retimed signals each having a data rate substantially equal to 25 gigabits per second; and
a second main demultiplexing block coupled to outputs of the two initial retiming flip flops, the second main demultiplexing block being configured to receive the two retimed signals and output the five additional parallel data signals.

28. A SerDes configured to support multiple data rates, the SerDes comprising:
a serializer portion including:
a first bypass stage for receiving half of a plurality of parallel transmit signals when the parallel transmit signals are at a first aggregate data rate substantially equal to 100 gigabits per second, the first bypass stage being configured to provide the half of the parallel transmit signals to a multiplexer stage;
the multiplexer stage coupled with an output of the first bypass stage and configured to receive the half of the parallel transmit signals and generate a first plurality of serial transmit signals at half the first aggregate data rate;
a retiming stage coupled with an output of the multiplexer stage and configured to receive and retime the first serial transmit signals; and
an output stage coupled with an output of the retiming stage and configured to receive and output the first retimed serial transmit signals to a plurality of transmit optics when the parallel transmit signals are at the first aggregate data rate; and
a deserializer portion including:
an input stage for receiving half of a plurality of serial receive signals from a plurality of receive optics and providing the half of the serial receive signals to a retiming stage when the serial receive signals are at the first aggregate data rate;
the retiming stage coupled with an output of the input stage and configured to receive and retime the half of the serial receive signals;
a demultiplexer stage coupled with an output of the retiming stage and configured to receive the retimed serial receive signals and generate a first plurality of parallel receive signals at half the first aggregate data rate; and
a second bypass stage coupled with the demultiplexer stage for receiving the first parallel receive signals and providing them to a host when the serial receive signals are at the first aggregate data rate.

29. The SerDes of claim 28, wherein:
for the serializer portion:
the first bypass stage is further configured to receive all of the plurality of parallel transmit signals when the parallel transmit signals are at a second aggregate data rate and is further configured to decode the parallel transmit signals at the second aggregate data rate into a plurality of decoded parallel transmit signals,
the multiplexer stage is further configured to receive the decoded parallel transmit signals and generate a second plurality of serial transmit signals at the second aggregate data rate, wherein the multiplexing function performed by the multiplexer stage is different depending on the aggregate data rate of the parallel transmit signals;
the retiming stage is further configured to receive and retime the second serial transmit signals; and
the output stage is further configured to receive the second retimed serial transmit signals and:
output the second retimed serial transmit signals to two transmit optics if the second aggregate data rate is substantially equal to 43 gigabits per second DQPSK; or
combine the second retimed serial transmit signals into one high speed serial transmit signal for output to one transmit optic if the second aggregate data rate is substantially equal to 40 gigabits per second very short range or 43 gigabits per second transport; and
for the deserializer portion:
the input stage is further configured to:
receive one high speed serial receive signal at the second aggregate data rate, divide the one high speed serial receive signal into two serial receive signals, and provide the two serial receive signals to the retiming stage if the second aggregate data rate is substantially equal to 40 gigabits per second very short range or 43 gigabits per second transport; or receive two serial receive signals at the second aggregate data rate and provide the two serial receive signals to the retiming stage if the second aggregate data rate is substantially equal to 43 gigabits per second DQPSK the retiming stage is further configured to receive and retime the two serial receive signals at the second aggregate data rate;

the demultiplexer stage is further configured to receive the retimed serial receive signals and generate a second plurality of parallel receive signals at the second aggregate data rate; and the second bypass stage is further configured to receive the second parallel receive signals and encode the second parallel receive signals into a plurality of encoded parallel receive signals.

30. The SerDes of claim 28, further comprising:

a first integrated circuit including the serializer portion and the deserializer portion, the first integrated circuit being configured to:

serialize five of ten parallel transmit signals each having a data rate substantially equal to 10 gigabits per second into two first retimed serial transmit signals each having a data rate substantially equal to 25 gigabits per second; and deserialize two of four serial receive signals each having a data rate substantially equal to 25 gigabits per second into five first parallel receive signals each having a data rate substantially equal to 10 gigabits per second; and a second integrated circuit including a second serializer portion and a second deserializer portion, the second integrated circuit being configured to:

serialize the other five of the ten parallel transmit signals into two additional retimed serial transmit signals each having a data rate substantially equal to 25 gigabits per second; and deserialize the other two of the four serial receive signals into five additional parallel receive signals each having a data rate substantially equal to 10 gigabits per second.

* * * * *